US008716835B2

United States Patent
Ando et al.

(10) Patent No.: US 8,716,835 B2
(45) Date of Patent: May 6, 2014

(54) BIPOLAR TRANSISTOR

(75) Inventors: Yuji Ando, Tokyo (JP); Hironobu Miyamoto, Tokyo (JP); Tatsuo Nakayama, Tokyo (JP); Yasuhiro Okamoto, Tokyo (JP); Takashi Inoue, Tokyo (JP); Kazuki Ota, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 491 days.

(21) Appl. No.: 13/124,873

(22) PCT Filed: Oct. 16, 2009

(86) PCT No.: PCT/JP2009/067909
§ 371 (c)(1),
(2), (4) Date: Jun. 7, 2011

(87) PCT Pub. No.: WO2010/047281
PCT Pub. Date: Apr. 29, 2010

(65) Prior Publication Data
US 2011/0278586 A1    Nov. 17, 2011

(30) Foreign Application Priority Data
Oct. 21, 2008    (JP) ................................. 2008-270884

(51) Int. Cl.
*H01L 29/66*    (2006.01)
*H01L 29/737*    (2006.01)
*H01L 29/20*    (2006.01)

(52) U.S. Cl.
USPC .............................. 257/565; 257/76; 257/197

(58) Field of Classification Search
USPC .............. 257/76–78, 197, 565–576, E29.089, 257/E29.183
See application file for complete search history.

(56) References Cited

U.S. PATENT DOCUMENTS

| 5,412,233 | A | 5/1995 | Dubon-Chevallier et al. |
| 5,689,122 | A | 11/1997 | Chandrasekhar |

(Continued)

FOREIGN PATENT DOCUMENTS

| JP | 1-132160 A | 5/1989 |
| JP | 1-144681 A | 6/1989 |

(Continued)

OTHER PUBLICATIONS

International Search Report for PCT/JP2009/067909 mailed Nov. 17, 2009.

(Continued)

*Primary Examiner* — Cuong Q Nguyen
(74) *Attorney, Agent, or Firm* — McGinn IP Law Group, PLLC

(57) ABSTRACT

A bipolar transistor is provided with an emitter layer, a base layer and a collector layer. The emitter layer is formed above a substrate and is an n-type conductive layer including a first nitride semiconductor. The base layer is formed on the emitter layer and is a p-type conductive including a second nitride semiconductor. The collector layer is formed on the base layer and includes a third nitride semiconductor. The collector layer, the base layer and the emitter layer are formed such that a crystal growth direction to the substrate surface is parallel to a substrate direction of [000-1]. The third nitride semiconductor contains $In_{yc}Al_{xc}Ga_{1-xc-yc}N$ ($0 \bullet xc \bullet 1$, $0 \bullet yc \bullet 1$, $0<xc+yc \bullet 1$). The a-axis length on the side of a surface in the third nitride semiconductor is shorter than the a-axis length on the side of the substrate.

12 Claims, 24 Drawing Sheets

(56) References Cited

U.S. PATENT DOCUMENTS

| | | | |
|---|---|---|---|
| 5,767,540 | A | 6/1998 | Shimizu |
| 5,828,087 | A | 10/1998 | Takahashi |
| 6,348,704 | B1 | 2/2002 | Teraguchi |
| 6,683,332 | B2 | 1/2004 | Shinozaki et al. |
| 6,806,513 | B2 | 10/2004 | Chau et al. |
| 6,881,988 | B2 | 4/2005 | Niwa et al. |
| 7,242,038 | B2 | 7/2007 | Oda et al. |
| 7,297,989 | B2 | 11/2007 | Otani et al. |
| 7,414,261 | B2 * | 8/2008 | Otsuka et al. ............... 257/26 |
| 7,569,910 | B2 | 8/2009 | Chang et al. |
| 7,595,544 | B2 * | 9/2009 | Kuroda et al. ............. 257/627 |
| 7,915,152 | B2 * | 3/2011 | Vaudo et al. ............... 257/103 |
| 8,101,973 | B2 | 1/2012 | O'Keefe et al. |
| 8,395,237 | B2 * | 3/2013 | Ando et al. ............... 257/565 |
| 2003/0157376 | A1 | 8/2003 | Vaudo et al. |
| 2005/0118746 | A1 | 6/2005 | Sumakeris et al. |
| 2006/0236923 | A1 | 10/2006 | Kouvetakis et al. |
| 2006/0286695 | A1 | 12/2006 | Yanashima et al. |
| 2008/0113497 | A1 | 5/2008 | Tachibana et al. |
| 2009/0065811 | A1 | 3/2009 | Chang et al. |
| 2010/0001290 | A1 | 1/2010 | Nonaka |

FOREIGN PATENT DOCUMENTS

| | | |
|---|---|---|
| JP | 2003518776 A | 6/2003 |
| JP | 2004140339 A | 5/2004 |
| JP | 2006128554 A | 5/2006 |
| JP | 2006253503 A | 9/2006 |
| JP | 2007188991 A | 7/2007 |
| JP | 2008004779 A | 1/2008 |
| WO | 2004061971 A | 7/2004 |

OTHER PUBLICATIONS

L. S. McCarthy et al., "AlGaN/GaN Heterojunction Bipolar Transistor", IEEE Electron Device Letters, vol. 20, No. 6, Jun. 1999. pp. 277-279.

Chinese Office Action dated Mar. 22, 2013, with English translation.

U.S Office Action for U.S. Appl. No. 13/124,873 dated Jul. 17, 2012.

Chinese Office Action dated Apr. 2, 2013, with English translation.

Notice of references cited for U.S. Appl. No. 13/124,872 dated Nov. 21, 2012.

Japanese Office Action dated Feb. 12, 2014 with an English translation.

* cited by examiner

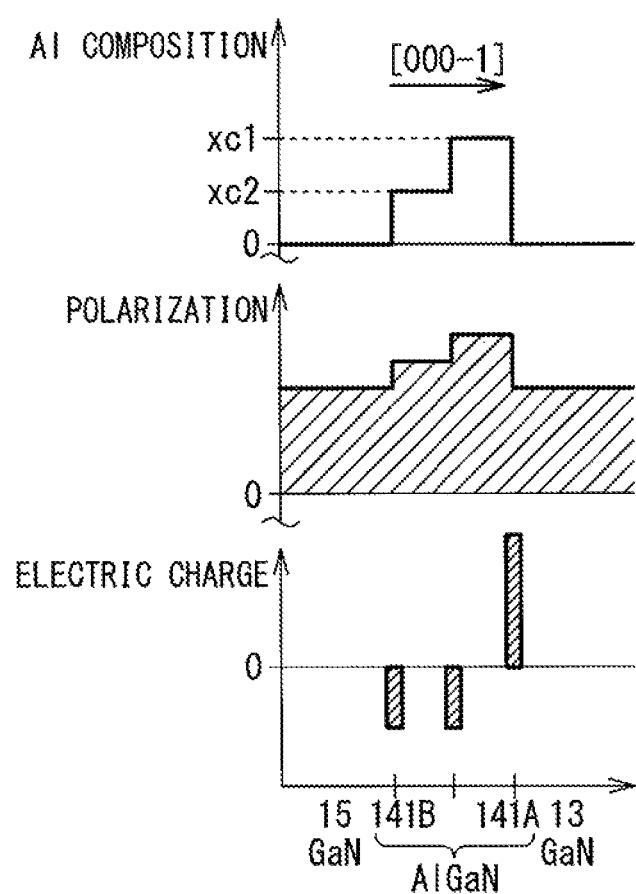

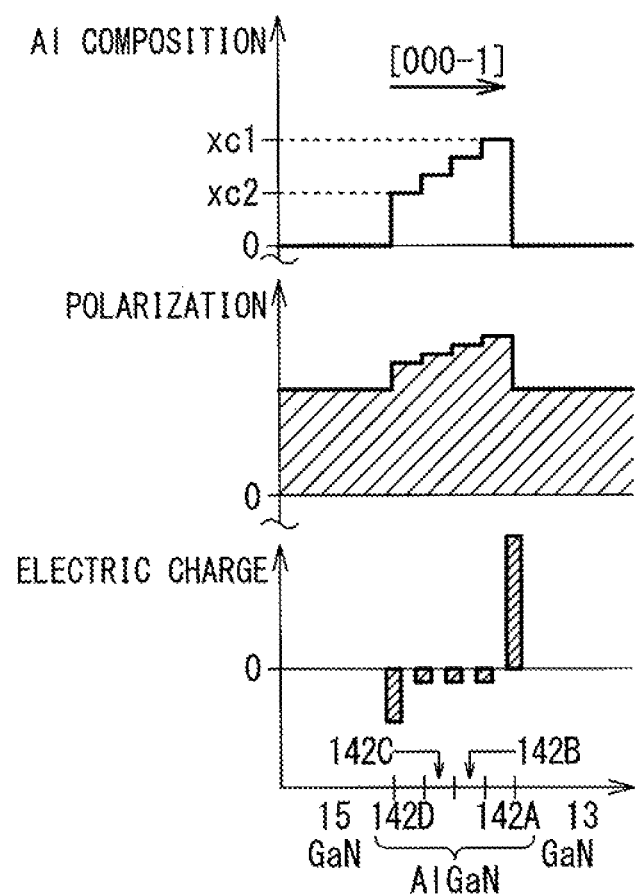

BIPOLAR TRANSISTOR

This application is the National Phase of PCT/JP2009/067909, filed Oct. 16, 2009, which claims a priority based on Japanese Patent Application No. 2008-270884 filed on Oct. 21, 2008. The disclosure of thereof is incorporated herein in by reference.

TECHNICAL FIELD

The present invention relates to a bipolar transistor, and more particularly, relates to a bipolar transistor that includes a III-group element nitride semiconductor as a main material.

BACKGROUND ART

A bipolar transistor is known that includes a III-group element nitride semiconductor as a main material. FIG. 1 is a sectional view showing a typical bipolar transistor. Such a bipolar transistor is reported in "AlGaN/GaN Heterojunction Bipolar Transistor" (IEEE Electron Device Letters, Vol. 20, No. 6, pp. 277, 1999) by L. S. McCarthy, et. al.

In FIG. 1, the bipolar transistor is provided with a sapphire substrate 100, a sub collector layer 103 made of high concentration n-type GaN, a collector layer 104 made of low concentration n-type GaN, a base layer 105 made of p-type GaN, and an emitter layer 106 made of n-type $Al_{0.1}Ga_{0.9}N$. A crystal growth direction with respect to a substrate surface is parallel to a [0001] direction. An emitter electrode 10E is formed in contact with the n-type AlGaN emitter layer 106, a base electrode 10B is formed in contact with the p-type GaN base layer 105, and a collector electrode 10C is formed in contact with the n-type GaN sub collector layer 103.

As a related technique, Japanese Patent Publication JP 2004-140339A (corresponding to U.S. Pat. No. 6,856,005B2) discloses a device having a nitride heterostructure and its manufacturing method. The device has the nitride hetero-structure made of InN itself or as a main component and has a crystal that serves as a nitrogen polarization surface or a surface having a property similar thereto on at least a portion.

Also, Japanese Patent Publication JP 2003-518776A (WO 01/048829 Gazette (corresponds to U.S. Pat. No. 6,858,509B2)) discloses a collector-up hetero-junction bipolar transistor and its manufacturing method. The hetero-junction bipolar transistor is a collector-up hetero-junction bipolar transistor. This hetero-junction bipolar transistor has an emitter layer (EM), a base layer (BA) and a collector layer (CO), which are laminated on a substrate. A surface area of a base-emitter active junction is smaller than a surface area of a base-collector active junction. A sensibility of a material of the base layer to a conductive ion implantation is lower than that of a material of the emitter layer to the same ion implantation.

Also, WO 2004/061971 Gazette (corresponds to US Patent Publication US 2005/224831A1) discloses a p-type nitride semiconductor structure and a bipolar transistor. In this p-type nitride semiconductor structure, a re-grown p-type nitride semiconductor layer is formed on a p-type nitride semiconductor subjected to etching to include In.

The inventor newly discovered the following facts. FIG. 2 is an energy band diagram of the bipolar transistor shown in FIG. 1. The energy band diagram shows a case where in the bipolar transistor shown in FIG. 1, a forward bias is applied between the base and the emitter, and a reverse bias is applied between the base and the collector. According to a band calculation, it is known that an L-M valley and a second • valley exist on a high energy side by about 2.0 eV from a bottom of a conduction band of GaN, namely, from a • valley. In FIG. 2, they are collectively shown as an "upper valley" (represented by a two-dotted chain line in FIG. 2).

As shown in FIG. 2, in the bipolar transistor in FIG. 1, electric field strength is maximum in the vicinity of a boundary between the base layer 105 and the collector layer 104. For this reason, the electrons injected from the base layer 105 into the collector layer 104 are changed to have high energy so that they receive phonon scattering to transit to the upper valley. For this reason, the bipolar transistor has a tendency that a carrier velocity decreases at a time of a high voltage operation so that a cut-off frequency is decreased. Moreover, the electrons are easy to change a high energy state in the collector layer 104, and GaN of the collector layer 104 has a relatively small band gap. Thus, avalanche breakdown is easily generated. For this reason, this bipolar transistor has a problem that a collector breakdown voltage is low.

CITATION LIST

Patent Literature

[Patent Literature 1]: JP 2004-140339A
[Patent Literature 2]: JP 2003-518776A
[Patent Literature 3]: WO 2004/061971

Non-Patent Literature

[Non-Patent Literature 1]: "AlGaN/GaN Heterojunction Bipolar Transistor" (IEEE Electron Device Letters, Vol. 20, No. 6, pp. 277, 1999) by L. S. McCarthy, et. al.

SUMMARY OF THE INVENTION

An object of the present invention is to provide a bipolar transistor, which solves the above-mentioned problems, and which is high in collector breakdown voltage and is excellent in electron transportation property even under a high voltage.

A bipolar transistor of the present invention has an emitter layer, a base layer and a collector layer. The emitter layer is formed above a substrate and includes a first nitride semiconductor and is an n-type conductive layer. The base layer is formed on the emitter layer and includes a second nitride semiconductor and is a p-type conductive layer. The collector layer is formed on the base layer and includes a third nitride semiconductor. The collector layer, the base layer and the emitter layer are formed such that a crystal growth direction with respect to a substrate surface is parallel to a [000-1] direction. The third nitride semiconductor includes $In_{yc}Al_{xc}Ga_{1-xc-yc}N$ (0•xc•1, 0•yc•1 and 0<xc+yc•1). An a-axis length of the third nitride semiconductor on the surface side is shorter than an a-axis length thereof on the substrate side.

According to the present invention, the bipolar transistor that is high in collector breakdown voltage and excellent in electron transportation property even under the high voltage.

BRIEF DESCRIPTION OF THE DRAWINGS

The above and other objects, advantages and features of the present invention would be understood in detail by considering the attached drawings and reading the descriptions of the next exemplary embodiments:

FIG. 4A is a graph showing a typical example of an Al composition distribution, a polarization quantity distribution and a charge distribution in the bipolar transistor according to the first exemplary embodiment of the present invention;

FIG. 4B is a graph showing a typical example of an Al composition distribution, a polarization quantity distribution and a charge distribution in the bipolar transistor according to the first exemplary embodiment of the present invention;

DESCRIPTION OF PREFERRED EMBODIMENTS

Hereinafter, a bipolar transistor of the present invention will be described below with reference to the attached drawings.

[First Exemplary Embodiment]

Figure 3:
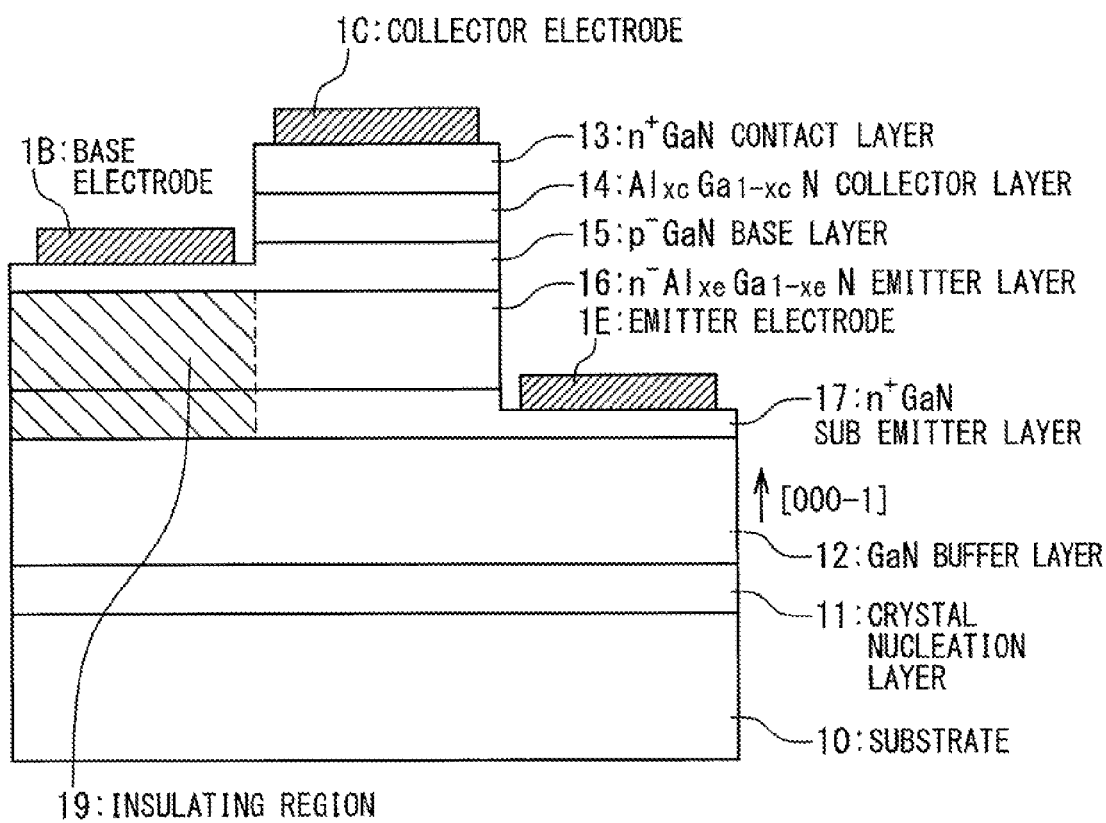
FIG. 3 is a sectional view showing structure of a bipolar transistor according to a first exemplary embodiment of the present invention.

The structure of the bipolar transistor according to a first exemplary embodiment of the present invention will be described below. FIG. 3 is a sectional view showing the structure of the bipolar transistor according to the first exemplary embodiment of the present invention. As shown in FIG. 3, the bipolar transistor is provided with a substrate 10, a crystal nucleation layer 11, a buffer layer 12, a sub emitter layer 17, an emitter layer 16, a base layer 15, a collector layer 14, a contact layer 13, an insulating region 19, an emitter electrode 1E, a base electrode 1B and a collector electrode 1C.

The substrate 10 is a (000-1) plane silicon carbide (SiC) substrate. The crystal nucleation layer 11 is formed of AlN on the substrate 10. The buffer layer 12 is formed of undoped GaN on the crystal nucleation layer 11. The sub emitter layer 17 is formed of high concentration n-type GaN on the buffer layer 12. The emitter layer 16 is formed of n-type AlGaN on the sub emitter layer 17. The base layer 15 is formed of p-type GaN on the emitter layer 16. The collector layer 14 is formed of undoped AlGaN on the base layer 15. The contact layer 13 is formed of the high concentration n-type GaN on the collector layer 14. The emitter electrode 1E is formed to contact the sub emitter layer 17 (the n-type GaN layer). The base electrode 1B is formed to contact the base layer 15 (p-type GaN layer). The collector electrode 1C is formed to contact the contact layer 13 (n-type GaN layer). Ohmic contacts are attained in the respective electrodes. The insulating region 19 is formed in the sub emitter layer 17 and the emitter layer 16 below the base electrode 1B through the base layer 15.

The bipolar transistor is manufactured by the following steps (A) and (B). (A) At first, for example, the respective layers formed of materials to be described below and having film thicknesses to be described below are laminated in an order on the (000-1) plane of the SiC substrate 10 by using a metal-organic chemical vapor deposition (hereinafter, to be referred to as a "MOCVD") method.

(A-1) The crystal nucleation layer 11: undoped AlN, and 200 nm.

(A-2) The buffer layer 12: undoped GaN, 1·m.

(A-3) The sub emitter layer 17: n-type GaN (Si: $3\times10^{18}$ cm$^{-3}$), 1 ·m.

(A-4) The emitter layer 16: n-type $Al_{xe}Ga_{1-xe}N$ (Si: $5\times10^{17}$ cm$^{-3}$), 500 nm.

(A-5) The base layer 15: p-type GaN (Mg: $1\times10^{19}$ cm$^{-3}$), 100 nm.

(A-6) The collector layer 14: undoped $Al_{xc}Ga_{1-xc}N$ layer (xc=xc2→xc1), 500 nm.

(A-7) The contact layer 13: n-type GaN layer 13 (Si: $1\times10^{19}$ cm$^{-3}$), 50 nm.

Those films have the crystal growth directions parallel to the [000-1] direction of the substrate.

Here, the collector layer 14 that is the AlGaN layer has a gradient composition structure or a stepped composition structure in which the Al composition xc is modulated in a film thickness direction. For example, it is supposed that in the collector layer 14, the Al composition in the boundary with the contact layer 13 that is the n-type GaN layer is xc=xc1, and the Al composition in the boundary with the base layer 15 that is the p-type GaN layer is xc=xc2. In that case, 0•xc2<xc1•1 is satisfied. That is, the Al composition xc of the collector layer 14 increases toward the contact layer 13 from the base layer 15. The collector layer 14 is a strain lattice layer that is thinner than the critical film thickness upon dislocation generation. From the viewpoint of suppressing the dislocation generation in the collector layer 14 and getting the excellent crystal quality, 0•xc2<xc1•0.5 is further preferable. In the present exemplary embodiment, when xc1=0.2 and xc2=0 are satisfied and the thickness of the collector layer 14 is assumed to be 1•m or less, this is within the critical film thickness upon dislocation generation.

Also, it is supposed that the Al composition xe of the emitter layer 16 that is the AlGaN layer is 0•xe•1. From the viewpoint of suppressing the dislocation generation in the emitter layer 16 and getting the excellent crystal quality, 0•xe•0.5 is further preferable. In a case of the present exemplary embodiment, for example, when xe=0.1 is satisfied and the thickness of the emitter layer 16 is 1•m or less, this is within the critical film thickness upon dislocation generation.

Also, as an n-type impurity, silicon (Si) is used. As a p-type impurity, magnesium (Mg) is used. However, as the p-type impurity, beryllium (Be) may be used. Also, although the AlGaN layer as the collector layer 14 is described to be undoped, this layer may be of a type in which the impurity concentration is about $1 \times 10^{17}$ cm$^{-3}$ or less.

(B) In succession, the patterning is performed on a lamination structure formed at the above (A) step and the respective electrodes are formed thereon in accordance with the following order. Consequently, the bipolar transistor is manufactured.

(B-1) At first, a chemical vapor deposition (hereinafter, to be referred to as a "CVD") method is used to form a silicon oxide (SiO$_2$) film. (B-2) In succession, the patterning of a collector mesa region is performed on the SiO$_2$ film (the formation of the pattern that has an opening in a region in which a base electrode is to be formed). (B-3) After that, by using the patterned SiO$_2$ film as mask and using a reactive ion etching (hereinafter, to be referred to as "RIE") method of using chloride (Cl$_2$)-based gas, the contact layer 13 and a part of the collector layer 14 are etched and removed (collector-mesa etching). Consequently, the base layer 15 that is the p-type GaN layer is exposed to form an outer base region. (B-4) Then, ions such as nitrogen (N) or boron (B) are implanted, and the resistances of the emitter layer 16 and the sub emitter layer 17 below the outer base region are made high, thereby forming the insulating region 19. (B-5) Next, metals such as palladium/gold (Pd/Au) are deposited on the outer base region. (B-6) After that, the SiO$_2$ film is lifted off, thereby forming the base electrode 1B. It should be noted that as the material of the p-type ohmic electrode, other materials such as titanium/gold (Ti/Au) may be used.

(B-7) Next, again, the CVD method is used to form a SiO$_2$ film. (B-8) In succession, the patterning for the base mesa region is performed on the SiO$_2$ film (the formation of a pattern that has the opening in the region in which the emitter electrode is to be formed). (B-9) After that, the patterned SiO$_2$ film is used as a mask, and by the RIE method of using the Cl$_2$-based gas, a part of the contact layer 13, the collector layer 14, the base layer 15 and the emitter layer 16 are etched and removed (base-mesa etching). Consequently, the sub emitter layer 17 that is the n-type GaN layer is exposed to form an outer emitter region. (B-10) In succession, for the SiO$_2$ film, an opening is formed in a region in which the collector electrode is to be formed. (B-11) Next, metals such as titanium/aluminum/nickel/gold (Ti/Al/Ni/Au) are deposited in the outer emitter region and the collector region. (B-12) After that, the SiO$_2$ film is lifted off, thereby forming the emitter electrode 1E and the collector electrode 1C. It should be noted that as the materials of the n-type ohmic electrode, other materials such as titanium/aluminum/molybdenum/gold (Ti/Al/Mo/Au), and titanium/aluminum/niobium/gold (Ti/Al/Nb/Au) may be used.

(B-13) Finally, an alloy process is entirely performed. Consequently, the ohmic contact is performed on each of the emitter electrode 1E, the base electrode 1B and the collector electrode 1C.

In this way, the bipolar transistor is manufactured as shown in FIG. 3.

Figure 4C:
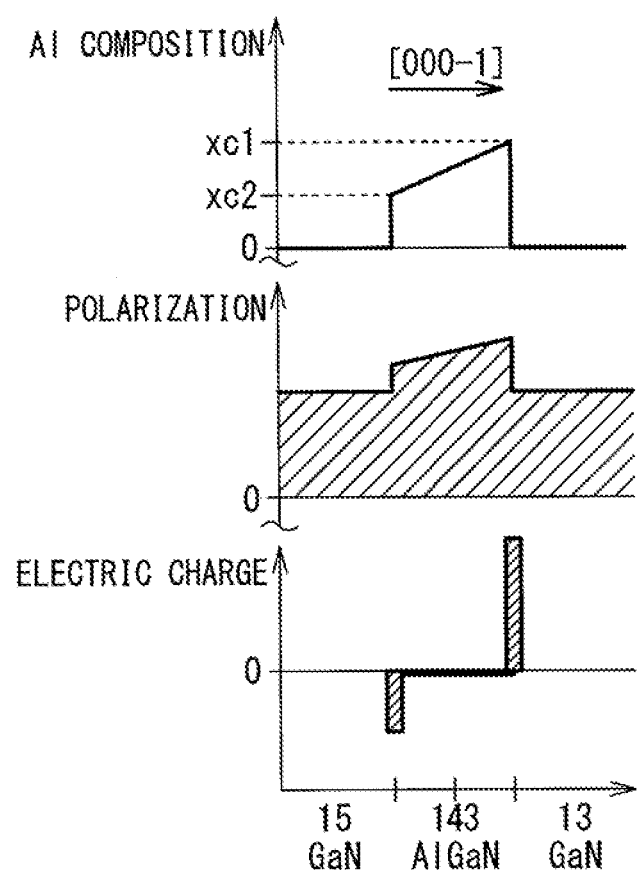
FIG. 4C is a graph showing a typical example of an Al composition distribution, a polarization quantity distribution and a charge distribution in the bipolar transistor according to the first exemplary embodiment of the present invention.

FIGS. 4A to 4C are graphs showing typical examples of an Al composition distribution, a polarization quantity distribution and a charge distribution in the bipolar transistor according to the first exemplary embodiment of the present invention. However, in FIGS. 4A to 4C, the crystal composition of the collector layer 14 (AlGaN layer) is selected such that an a-axis length on the side of the base layer 15 is longer than an a-axis length on the side of the contact layer 13. For example, it is selected such that the a-axis length decreases from the base layer 15 toward the contact layer 13. Also, the vertical axis indicates an Al composition, a polarization and a charge from the top graph, respectively and separately. The horizontal axis indicates a position in the bipolar transistor (the base layer 15 (GaN layer), the collector layer 14 (AlGaN layer and the contact layer 13 (GaN layer)).

FIG. 4A shows a case where the collector layer 14 (AlGaN layer) has a 2-layer structure in which an Al$_{xc2}$Ga$_{1-xc2}$N layer 141B and an Al$_{xc1}$Ga$_{1-xc1}$N layer 141A are formed in order. Here, 0•xc2<xc1•1 is satisfied as shown in the top graph. In a case of a (000-1) plane growth, tensile strain is generated inside the AlGaN layer (collector layer 14) on the GaN layer (base layer 15), and the positive polarization is generated inside the AlGaN layer (collector layer 14). Here, as a sign of the polarization, a case that the surface side is positively charged is regarded to be positive. In the present exemplary embodiment, the a-axis length decreases from the base layer 15 toward the contact layer 13. For this reason, as indicated in the middle graph, piezo-polarization is changed to a direction in which the positive polarization increases (an increased direction) from the base layer 15 toward the contact layer 13. At that time, as indicated in the bottom graph, space charges corresponding to a discontinuous quantity of a polarization value are generated. Thus, negative charges are generated in the boundary between the AlGaN layer 141A and the AlGaN layer 141B and in the boundary between the AlGaN layer 141B and the base layer 15 (GaN layer). The positive charges are generated in the boundary between the contact layer 13 (GaN layer) and the AlGaN layer 141A.

For example, in a case of xc1=0.2 and xc2.0.1, the negative charges of the plane density of $5.4 \times 10^{12}$ cm$^{-2}$ are generated in the boundary between the AlGaN layer 141A and the AlGaN layer 141B and in the boundary between the AlGaN layer 141B and the base layer 15 (GaN layer), respectively. The positive charges of the plane density of $1.1 \times 10^{13}$ cm$^{-2}$ are generated in the boundary between the contact layer 13 (GaN layer) and the AlGaN layer 141A.

Figure 1:
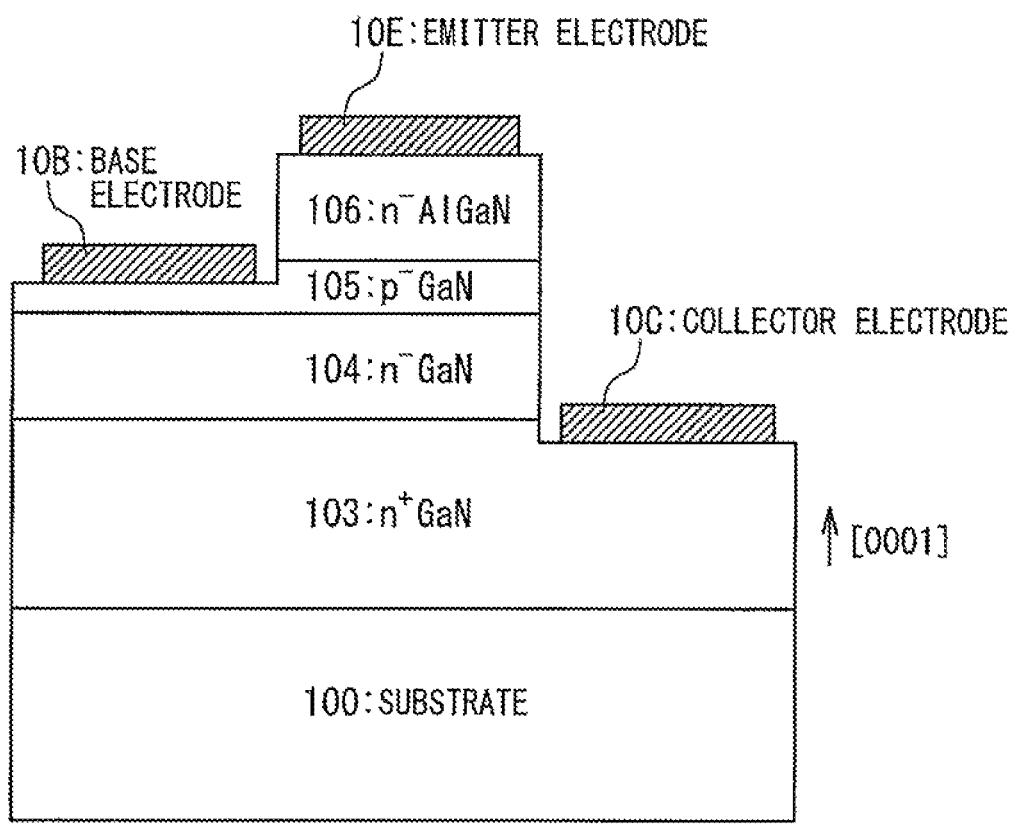
FIG. 1 is a sectional view showing a structure of a typical bipolar transistor.
Figure 2:
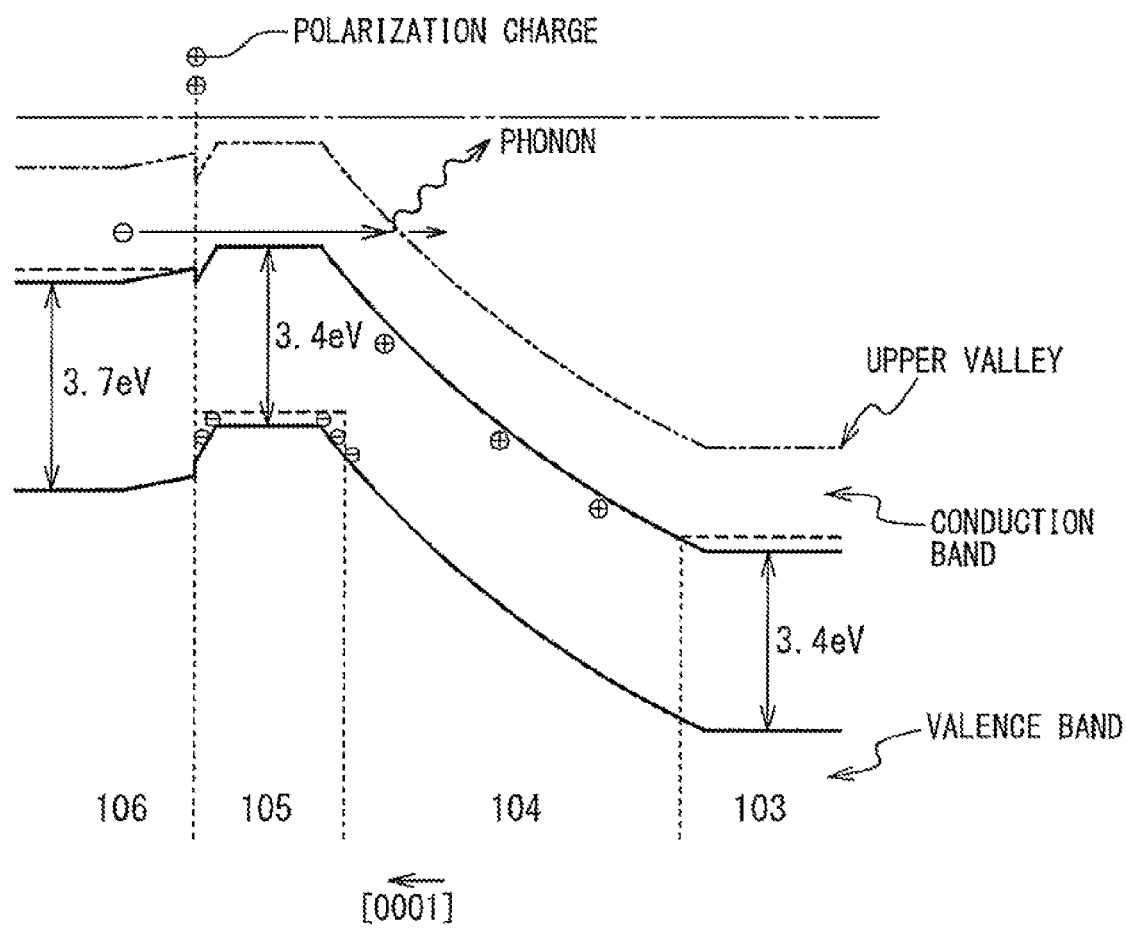
FIG. 2 is an energy band diagram of the bipolar transistor shown in FIG. 1.

FIG. 4B shows that the collector layer 14 (AlGaN layer) is a 4-layer structure of an $Al_{xc2}Ga_{1-xc2}N$ layer 142D, an $Al_{xcc}Ga_{1-xcc}N$ layer 142C, an layer 142B and an $Al_{xcb}Ga_{1-xcb}N$ layer 142A formed in this order. Here, as shown in the top graph, 0•xc2<xcc<xcb<xc1•1 is satisfied. In the present exemplary embodiment, the a-axis length decreases from the base layer 15 toward the contact layer 13. Thus, also, in this case, as shown in the middle graph, the piezo polarization is changed to a direction in which the positive polarization increases (the increased direction) toward the contact layer 13 from the base layer 15. At that time, as shown in the bottom graph, the space charges are generated in accordance with a discontinuous quantity of the polarization value. Thus, in accordance with the principle similar to FIG. 2A, the negative charges are generated in the boundary between the AlGaN layer 142A and the AlGaN layer 142B, in the boundary between the AlGaN layer 142B and the AlGaN layer 142C, in the boundary between the AlGaN layer 142C and the AlGaN layer 142D, and in the boundary between the AlGaN layer 142D and the base layer 15 (GaN layer). Also, the positive charges are generated in the boundary between the contact layer 13 (GaN layer) and the AlGaN layer 142A.

For example, in a case of xc1=0.2, xcb=0.15, xcc=0.1 and xc2=0.05, the negative charges of the plane density of $2.7 \times 10^{12}$ cm$^{-2}$ are generated in the boundary between the AlGaN layer 142A and the AlGaN layer 142B, in the boundary between the AlGaN layer 142B and the AlGaN layer 142C, in the boundary between the AlGaN layer 142C and the AlGaN layer 142D, and in the boundary between the AlGaN layer 142D and the base layer 15 (GaN layer). The positive charges of a plane density of $1.1 \times 10^{13}$ cm$^{-2}$ are generated in the boundary between the contact layer 13 (GaN layer) and the AlGaN layer 142A.

FIG. 4C shows a case where the collector layer 14 (AlGaN layer) is configured from a gradient composition AlGaN layer 143, and the Al composition xc is gradually increased from xc2 to xc1, toward the contact layer 13 (GaN layer) from the base layer 15 (GaN layer). Here, as indicated in the top graph, 0•xc2<xc1•1 is satisfied. This corresponds to a case that the number of steps is set to a very large value in the stepped composition structure shown in FIG. 4B. For this reason, as indicated in the middle graph, a polarization quantity of the AlGaN layer 143 is smoothly changed. Consequently, as shown in the bottom graph, the negative charges are continuously generated inside the AlGaN layer 143.

For example, when in a case of xc1=0.2 and xc2=0, the layer thickness of the gradient composition AlGaN layer 143 is 500 nm, the negative charges of a volume density of $2.2 \times 10^{17}$ cm$^{-3}$ are generated inside the AlGaN layer 143. The positive charges of a plane density of $1.1 \times 10^{13}$ cm$^{-2}$ are generated in the boundary between the contact layer 13 (GaN layer) and the AlGaN layer 143.

Figure 5:
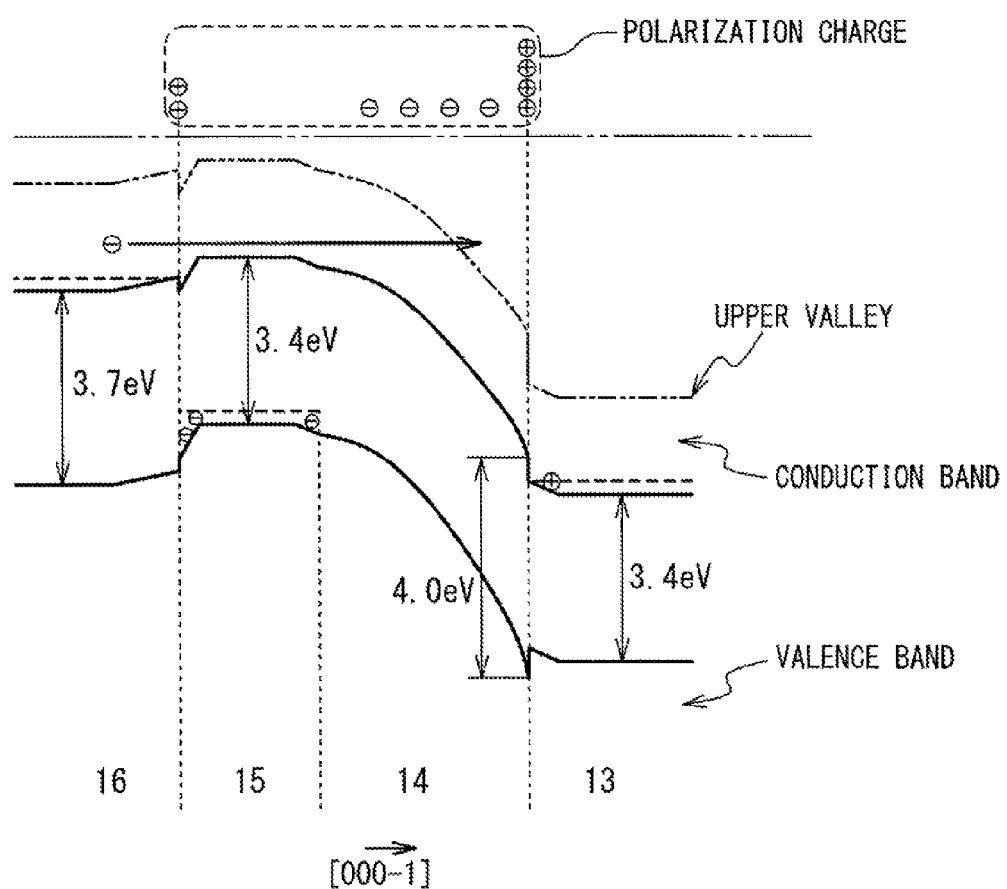
FIG. 5 is a diagram showing one example of an energy band of the bipolar transistor according to the first exemplary embodiment of the present invention.

As mentioned above, in any of the cases of FIGS. 4A, 4B and 4C, the negative charges are generated inside the collector layer 14 (AlGaN layer). Thus, the effect similar to the case where the p-type doping is performed is obtained. As one example, the case of FIG. 4C will be further described. FIG. 5 is a diagram showing an example of the energy band structure of the bipolar transistor according to the first exemplary embodiment of the present invention. The energy band structure shows a case where in FIG. 4C, xe=0.1, xc1.0.2 and xc2=0 are satisfied, and a forward bias is applied between the base and the emitter (the base layer 15 and the emitter layer 16) and a reverse bias is applied between the base and the collector (the base layer 15 and the collector layer 14). However, the "polarization charges" shown on the top portion of the figure schematically shows the generation positions of the polarization charges generated in a valence band (indicated as rough positions in the contact layer 13, the collector layer 14, the base layer 15 and the emitter layer 16) and the relative quantities (represented as the rough number of positive charges and the rough number of negative charges) (similar in FIGS. 7, 9, 11, 13, 15, 18, 20 and 2).

An internal electric field is generated inside the collector layer 14 (AlGaN layer) so that a potential to electrons is convex in an upper direction. Thus, the electric field concentration in the boundary between the base and the collector (the base layer 15 and the collector layer 14) is relaxed. Together with it, since the position at which the electric field strength is maximum is shifted to the contact layer 13, it becomes difficult for the electrons injected from the base layer 15 into the collector layer 14 to have high energy. For this reason, the valley scattering is suppressed, thereby improving the carrier velocity and improving the cut-off frequency.

Also, the band gap of the collector layer 14 (AlGaN layer) is large on the side of the contact layer 13. The position at which the electric field strength is maximum is also shifted to the contact layer 13. For this reason, the band gap at the position at which the electric field is maximum becomes larger, which makes it difficult to cause avalanche breakdown. Thus, the collector breakdown voltage is also improved.

In the present exemplary embodiment, the sub emitter layer 17 of the n-type GaN layer is formed to contact the emitter layer 16 of the n-type AlGaN layer. However, the gradient composition AlGaN layer may be inserted into in the boundary between the emitter layer 16 and the sub emitter layer 17, and the Al composition may be smoothly increased toward the emitter layer 16 from the sub emitter layer 17. In this case, a barrier against electrons due to a conduction band offset in a hetero junction is made small, thereby reducing an emitter resistance.

Also, although the base electrode 1B is formed to contact the base layer 15 that is the p-type GaN layer, the base electrode may be formed through the p-type GaN layer or p-type InGaN layer that is selectively re-grown only in an outer base region. In this case, since a crystal damage in the outer base layer that is generated by the RIE used in the collector mesa formation can be recovered through an annealing process, a base resistance is reduced.

Moreover, an ion implantation is performed to the emitter layer 16 and the sub emitter layer 17 below the outer base region, to form the insulating region 19. However, the emitter layer 16 and the sub emitter layer 17 that are located at the same location may be etched and removed. In this case, a current gain and a capacitance between the base and the emitter are further decreased, thereby improving a switching speed.

[Second Exemplary Embodiment]

Figure 6:
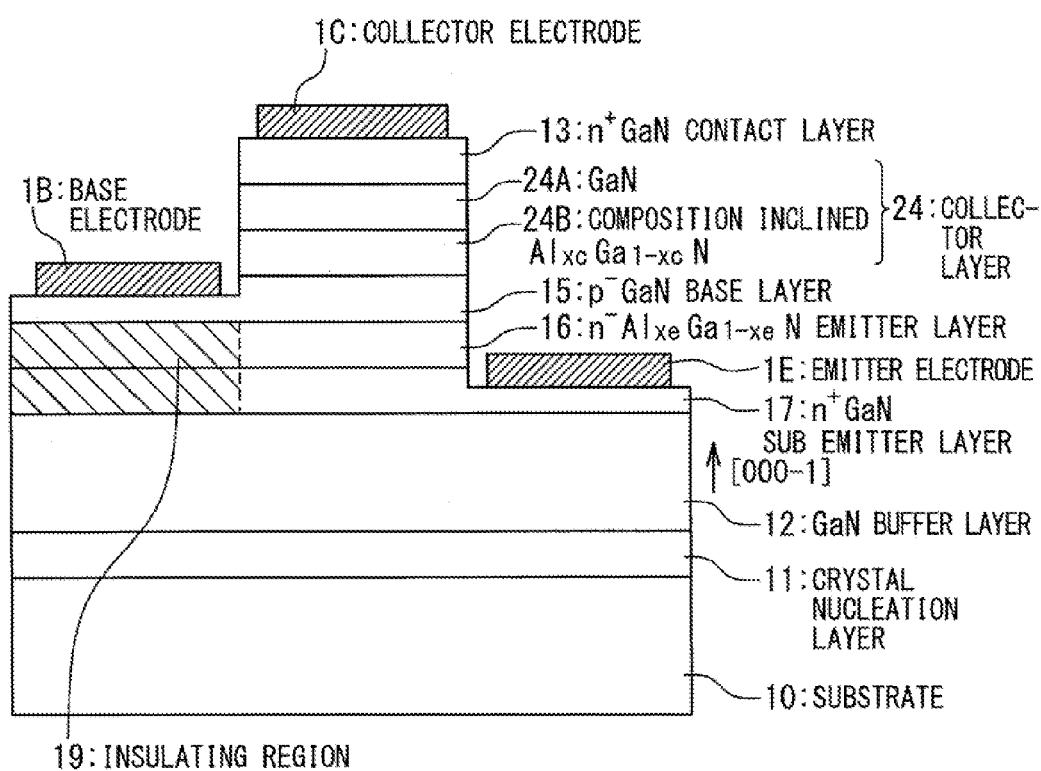
FIG. 6 is a sectional view showing the structure of the bipolar transistor according to a second exemplary embodiment of the present invention.

The structure of the bipolar transistor according to a second exemplary embodiment of the present invention will be described below. FIG. 6 is a sectional view showing the structure of the bipolar transistor according to the second exemplary embodiment of the present invention. In the first exemplary embodiment, the thickness of the collector layer 14 (AlGaN layer) is limited to the critical film thickness upon dislocation generation. For this reason, the collector layer 14 can not be made sufficiently thick, which limits the collector breakdown voltage. In the second exemplary embodiment, it is possible to cancel the foregoing limit of the collector breakdown voltage.

As shown in FIG. 6, the bipolar transistor is provided with the substrate 10, the crystal nucleation layer 11, the buffer layer 12, the sub emitter layer 17, the emitter layer 16, the base layer 15, a collector layer 24, the contact layer 13, the insulating region 19, the emitter electrode 1E, the base electrode 1B and the collector electrode 1C.

In the present exemplary embodiment, the collector layer 14 of the bipolar transistor in the first exemplary embodiment is replaced by the collector layer 24. The collector layer 24 has a 2-layer structure in which an undoped gradient composition $Al_{xc}Ga_{1-xc}N$ layer 24B and an undoped GaN layer 24A are laminated in this order.

The Al composition xc of the gradient composition $Al_{xc}Ga_{1-xc}N$ layer 24B is gradually increased from xc2 to xc1, toward the GaN layer 24A from the base layer 15 (p-type GaN layer). Here, 0•xc2<xc1•1 is satisfied. The state of the gradient composition $Al_{xc}Ga_{1-xc}N$ layer 24B is exemplified as the state of the collector layer 14 (AlGaN layer) of FIG. 4C. For example, it is supposed that xc1=0.2 and xc2=0 are satisfied, the layer thickness of the GaN layer 24A is 200 nm, and the layer thickness of the gradient composition $Al_{xc}Ga_{1-xc}N$ layer 24B is 500 nm. Here, the film thickness of the gradient composition AlGaN layer 24B is equal to or less than the critical film thickness upon dislocation generation. The manufacturing method of the bipolar transistor is the same as that of the first exemplary embodiment except that the materials of a part of films are different.

The feature of the present exemplary embodiment lies in that the GaN layer 24A is inserted between the contact layer 13 of the n-type GaN layer and the gradient composition AlGaN layer 24B. The layer thickness of the GaN layer 24A can be arbitrarily set without any limit of the critical film thickness. Thus, the film thickness of the collector layer 24 can be increased. Therefore, the collector breakdown voltage can be improved.

Figure 7:
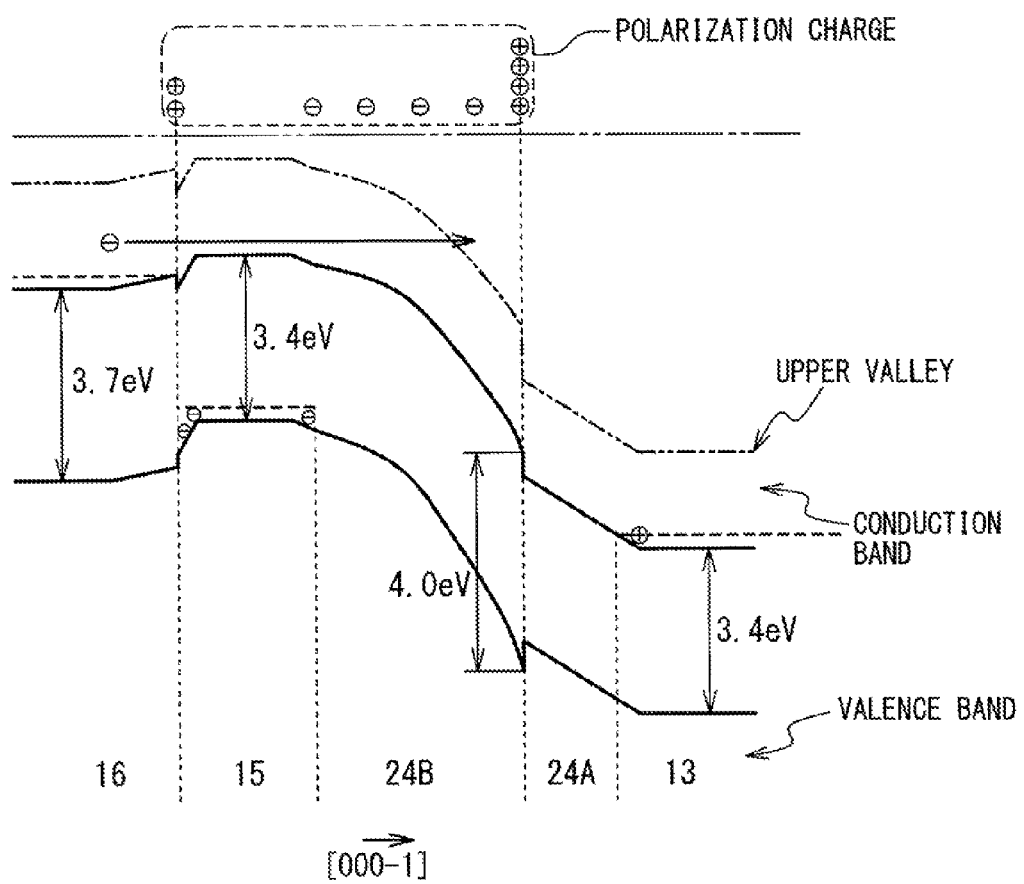
FIG. 7 is a diagram showing one example of an energy band of the bipolar transistor according to the second exemplary embodiment of the present invention.

The energy band of such a bipolar transistor will be described below. FIG. 7 is a diagram showing an example of the energy band structure of the bipolar transistor according to the second exemplary embodiment of the present invention. The energy band structure shows a case where in the bipolar transistor in FIG. 6, xe=0.1, xc1=0.2 and xc2=0 are satisfied, a forward bias is applied between the base and the emitter (the base layer 15 and the emitter layer 16), and a reverse bias is applied between the base and the collector (the base layer 15 and the collector layer 24).

The electric field strength inside the GaN layer 24A is uniform. On the other hand, negative charges are generated inside the gradient composition AlGaN layer 24B. For this reason, the internal electric field is generated, in which a potential to electrons is convex in an upper direction. For this reason, the electric field concentration in the boundary between the base and the collector (the base layer 15 and the collector layer 24) is relaxed. Together with it, the position at which the electric field strength is maximum is shifted to the contact layer 13. Thus, it becomes difficult for the electrons injected from the base layer 15 into the gradient composition AlGaN layer 24B of the collector layer 24 to have high energy. Therefore, the valley scattering is suppressed, thereby improving the carrier velocity and improving the cut-off frequency.

Also, the band gap of the gradient composition AlGaN layer 24B becomes larger toward the contact layer 13 (GaN layer). The position at which the electric field strength is maximum is also shifted to the contact layer 13. Thus, the band gap at the position at which the electric field is maximum becomes larger, which makes it difficult to cause the avalanche breakdown. Therefore, the collector breakdown voltage is also improved.

[Third Exemplary Embodiment]

Figure 8:
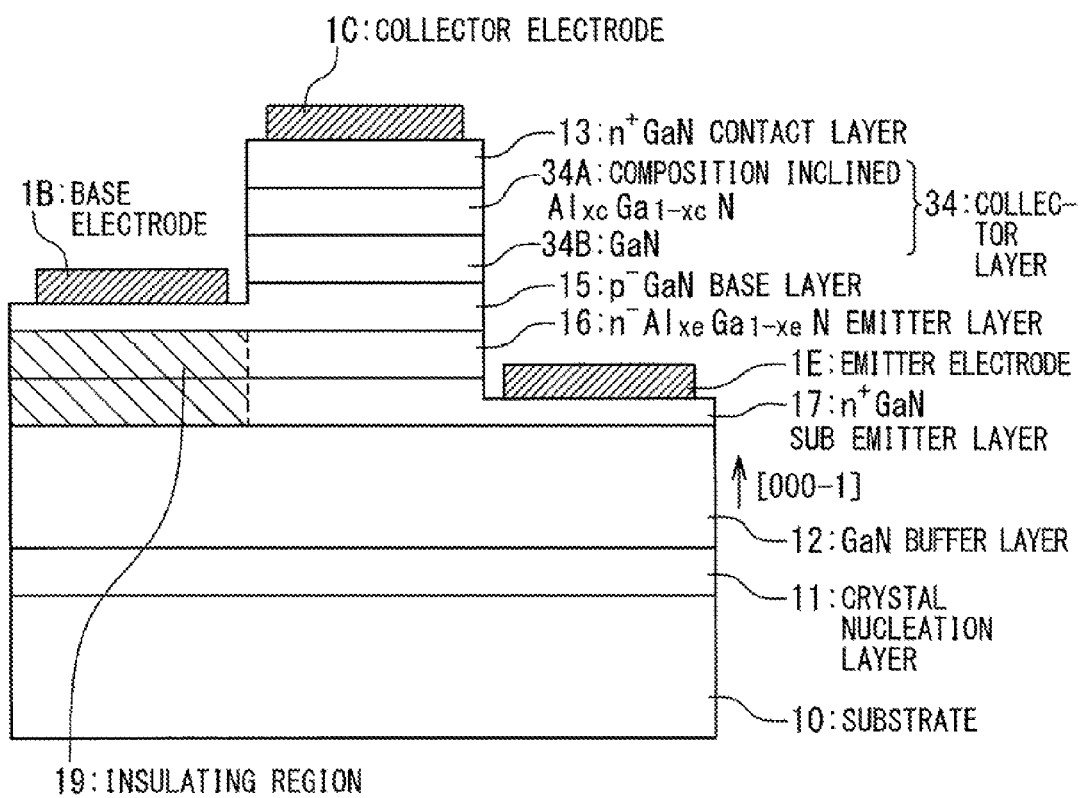
FIG. 8 is a sectional view showing the structure of the bipolar transistor according to a third exemplary embodiment of the present invention.

The structure of the bipolar transistor according to a third exemplary embodiment of the present invention will be described below. FIG. 8 is a sectional view showing the structure of the bipolar transistor according to the third exemplary embodiment of the present invention. In the first exemplary embodiment, the thickness of the collector layer 14 (AlGaN layer) is limited based on the critical film thickness upon dislocation generation. For this reason, the collector layer 14 can not be made sufficiently thick, which limits the collector breakdown voltage. In the third exemplary embodiment, it is possible to remove the limit of the collector breakdown voltage.

As shown in FIG. 8, the bipolar transistor is provided with the substrate 10, the crystal nucleation layer 11, the buffer layer 12, the sub emitter layer 17, the emitter layer 16, the base layer 15, a collector layer 34, the contact layer 13, the insulating region 19, the emitter electrode 1E, the base electrode 1B and the collector electrode 1C.

In the present exemplary embodiment, the collector layer 14 of the bipolar transistor in the first exemplary embodiment is replaced by the collector layer 34. The collector layer 34 has a 2-layer structure in which an undoped GaN layer 34B and an undoped gradient composition $Al_{xc}Ga_{1-xc}N$ layer 34A are laminated in this order.

The Al composition xc of the gradient composition $Al_{xc}Ga_{1-xc}N$ layer 34A is gradually increased from xc2 to xc1 from the GaN layer 34B toward the contact layer 13 (n-type GaN layer). Here, 0•xc2<xc1•1 is satisfied. The state of the gradient composition $Al_{xc}Ga_{1-xc}N$ layer 34A is exemplified as the state of the collector layer 14 (AlGaN layer) of FIG. 4C. For example, it is supposed that xc1=0.2 and xc2=0 are satisfied, the layer thickness of the gradient composition $Al_{xc}Ga_{1-xc}N$ layer 34A is 500 nm, and the layer thickness of the GaN layer 34B is 500 nm. Here, the film thickness of the gradient composition AlGaN layer 34A is equal to or less than the critical film thickness upon dislocation generation. The manufacturing method of the bipolar transistor is the same as that of the first exemplary embodiment except that the materials of a part of the films are different.

The feature of the present exemplary embodiment lies in that the GaN layer 34B is inserted between the gradient composition AlGaN layer 34A and the base layer 15 of the p-type GaN layer. The layer thickness of the GaN layer 34B can be arbitrarily set without any limit of the critical film thickness. Thus, the film thickness of the collector layer 34 can be increased. Therefore, the collector breakdown voltage can be improved.

Figure 9:
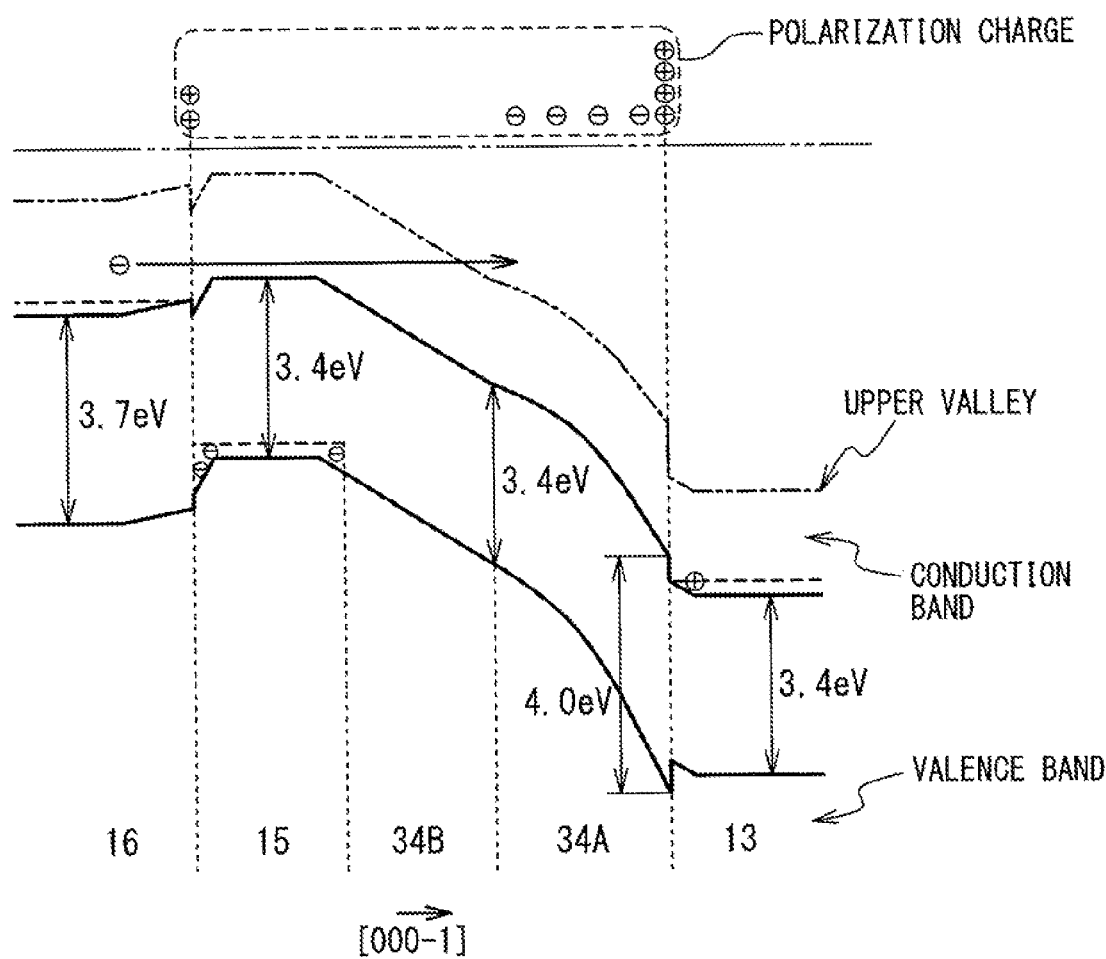
FIG. 9 is a diagram showing one example of the energy band of the bipolar transistor according to the third exemplary embodiment of the present invention.

The energy band of such a bipolar transistor will be described below. FIG. 9 is a diagram showing one example of the energy band of the bipolar transistor according to the third exemplary embodiment of the present invention. The energy band structure shows a case where in the bipolar transistor of FIG. 8, xe=0.1, xc1=0.2 and xc2=0 are satisfied, and a forward bias is applied between the base and the emitter (the base layer 15 and the emitter layer 16), and a reverse bias is applied between the base and the collector (the base layer 15 and the collector layer 34).

The electric field strength inside the GaN layer 34B is uniform. On the other hand, negative charges are generated inside the gradient composition AlGaN layer 34A. Thus, internal electric field is generated so that a potential to the electrons is convex in an upper direction. Thus, the electric field concentration in the boundary between the base and the collector (the base layer 15 and the collector layer 34) is relaxed. Together with it, the position at which the electric field strength is maximum is shifted to the side of the contact layer 13. Thus, it becomes difficult for the electrons injected from the base layer 15 into the GaN layer 34B of the collector layer 34 to have high energy. Therefore, the valley scattering is suppressed, thereby improving the carrier velocity and improving the cut-off frequency.

Also, the band gap of the gradient composition AlGaN layer 34A becomes larger toward the contact layer 13 (GaN layer). The position at which the electric field strength is maximum is also shifted to the side of the contact layer 13. Thus, the band gap at the position at which the electric field is maximum becomes larger, which makes it difficult to cause the avalanche breakdown. Therefore, the collector breakdown voltage is also improved.

[Fourth Exemplary Embodiment]

Figure 10:
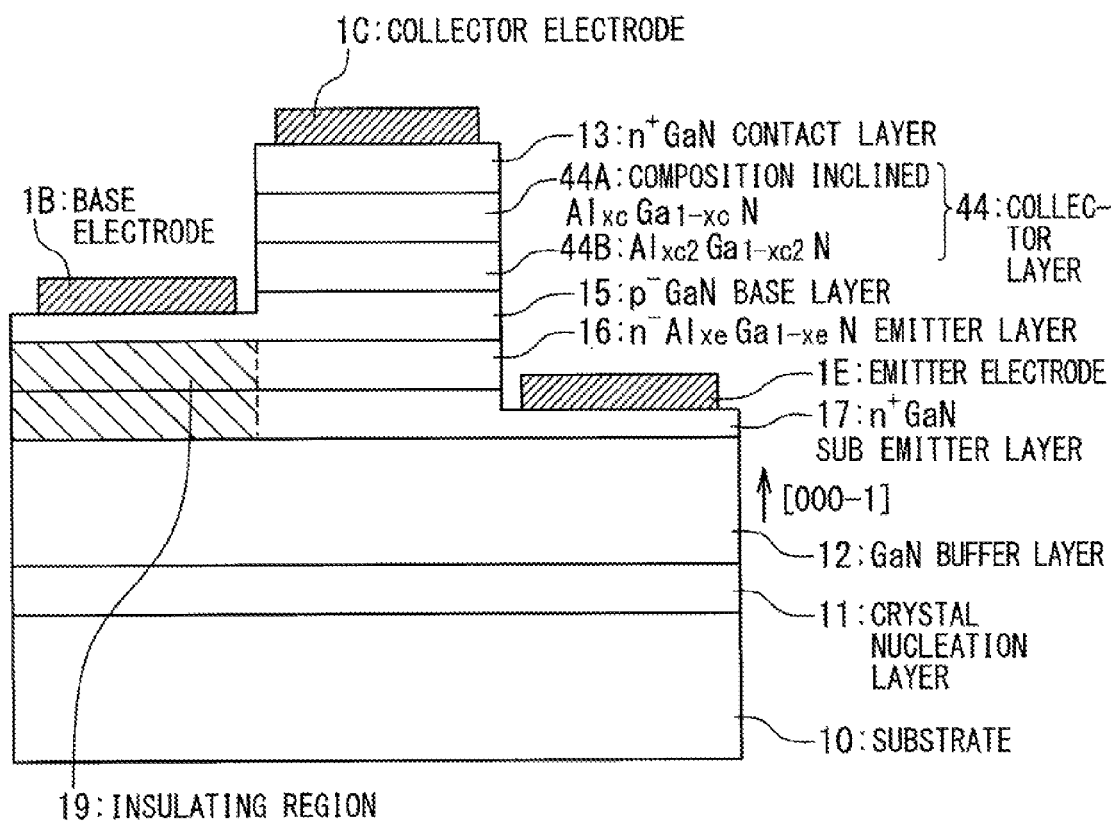
FIG. 10 is a sectional view showing the structure of the bipolar transistor according to a fourth exemplary embodiment of the present invention.

The structure of the bipolar transistor according to a fourth exemplary embodiment of the present invention will be described below. FIG. 10 is a sectional view showing the structure of the bipolar transistor according to the fourth exemplary embodiment of the present invention. In the third exemplary embodiment, materials of the base and materials of the collector are same to be GaN in the boundary between the base and the collector (the base layer and the collector layer). For this reason, since holes inside the base layer are diffused into the collector layer (AlGaN) and a base length is substantially enlarged so as to reduce a switching speed, and a possibility of generation of so-called Kirk effect can be considered. In the fourth exemplary embodiment, it is possible to surely protect the generation of the Kirk effect.

As shown in FIG. 10, the bipolar transistor is provided with the substrate 10, the crystal nucleation layer 11, the buffer layer 12, the sub emitter layer 17, the emitter layer 16, the base layer 15, a collector layer 44, the contact layer 13, the insulating region 19, the emitter electrode 1E, the base electrode 1B and the collector electrode 1C.

In the present exemplary embodiment, the collector layer 14 of the bipolar transistor in the first exemplary embodiment is replaced with the collector layer 44. The collector layer 44 has a 2-layer structure in which an undoped $Al_{xc2}Ga_{1-xc2}N$ layer 44B and an undoped gradient composition $Al_{xc}Ga_{1-xc}N$ layer 44A are laminated in this order.

The Al composition xc of the gradient composition $Al_{xc}Ga_{1-xc}N$ layer 44A is gradually increased from xc2 to xc1 from the AlGaN layer 44B toward the contact layer 13 (n-type GaN layer). Here, $0 \bullet xc2 < xc1 \bullet 1$ is satisfied. The state of the gradient composition $Al_{xc}Ga_{1-xc}$ layer 44A is exemplified as the state of the collector layer 14 (AlGaN layer) of FIG. 4C. For example, it is assumed that xc1=0.2 and xc2.0.1 are satisfied, and the layer thickness of the gradient composition $Al_{xc}Ga_{1-xc}N$ layer 44A is 250 nm, and the layer thickness of the layer 44B is 500 nm. Here, the film thickness of the gradient composition $Al_{xc}Ga_{1-xc}N$ layer 44A and the film thickness of the $Al_{xc2}Ga_{1-xc2}N$ layer 44B are both equal to or less than the critical film thickness upon dislocation generation. The manufacturing method of the bipolar transistor is the same as that of the first exemplary embodiment except that the materials of a part of films are different.

The feature of the present exemplary embodiment lies in that the AlGaN layer 44B as a middle composition layer is inserted between the gradient composition AlGaN layer 44A and the base layer 15 of the p-type GaN layer. The AlGaN layer 44B is larger in band gap than the base layer 15 (p-type GaN layer). For this reason, a valence band offset functions as a potential barrier against holes. Thus, the diffusion of the holes from the base layer 15 into the AlGaN layer 44B of the collector layer 44 is suppressed, thereby improving the Kirk effect.

Figure 11:
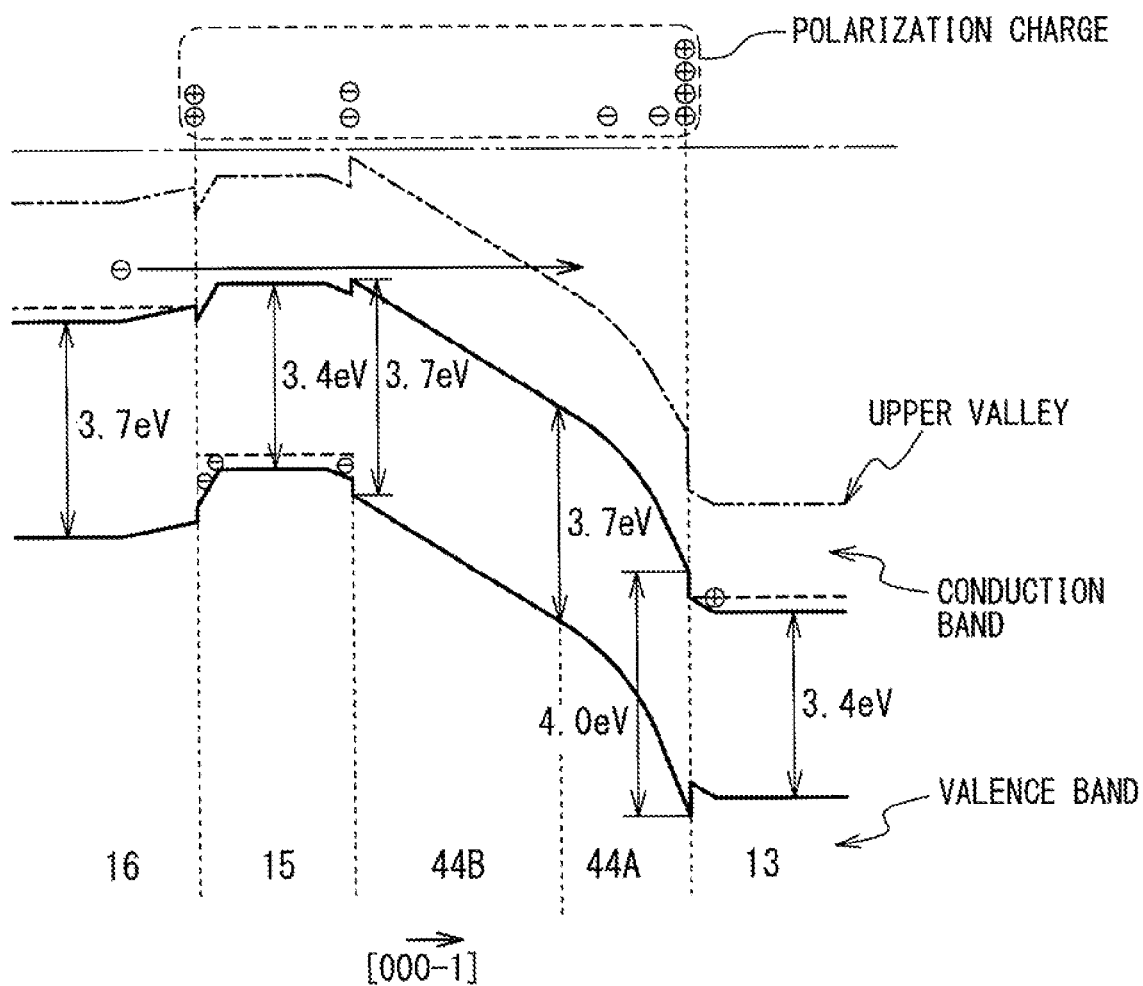
FIG. 11 is a diagram showing one example of an energy band of the bipolar transistor according to the fourth exemplary embodiment of the present invention.

The energy band of the above bipolar transistor will be described below. FIG. 11 is a diagram showing one example of the energy band structure of the bipolar transistor according to the fourth exemplary embodiment of the present invention. The energy band structure shows a case where in the bipolar transistor in FIG. 10, xe=0.1, xc1=0.2 and xc2=0.1 are satisfied, and a forward bias is applied between the base and the emitter (the base layer 15 and the emitter layer 16), and a reverse bias is applied between the base and the collector (the base layer 15 and the collector layer 34).

The electric field strength inside the $Al_{xc2}Ga_{1-xc2}N$ layer 44B is uniform. On the other hand, negative charges are generated inside the gradient composition $Al_{xc}Ga_{1-xc}N$ layer 44A. Thus, an internal electric field is generated so that a potential to electrons is convex in an upper direction. Thus, the electric field concentration in the boundary between the base and the collector (the base layer 15 and the collector layer 44) is relaxed. Together with it, the position at which the electric field strength is maximum is shifted to the contact layer 13. Therefore, it becomes difficult for the electrons injected from the base layer 15 into the $Al_{xc2}Ga_{1-xc2}N$ layer 44B of the collector layer 44 to have high energies. Therefore, the valley scattering is suppressed, thereby improving the carrier velocity and improving the cut-off frequency.

Also, the band gap of the AlGaN layer 44A becomes larger in a direction of the contact layer 13 (GaN layer). The position at which the electric field strength is maximum is also shifted to the contact layer 13. Thus, the band gap at the position at which the electric field is maximum becomes larger, which makes it difficult to cause avalanche breakdown. Therefore, the collector breakdown voltage is also improved.

[Fifth Exemplary Embodiment]

Figure 12:
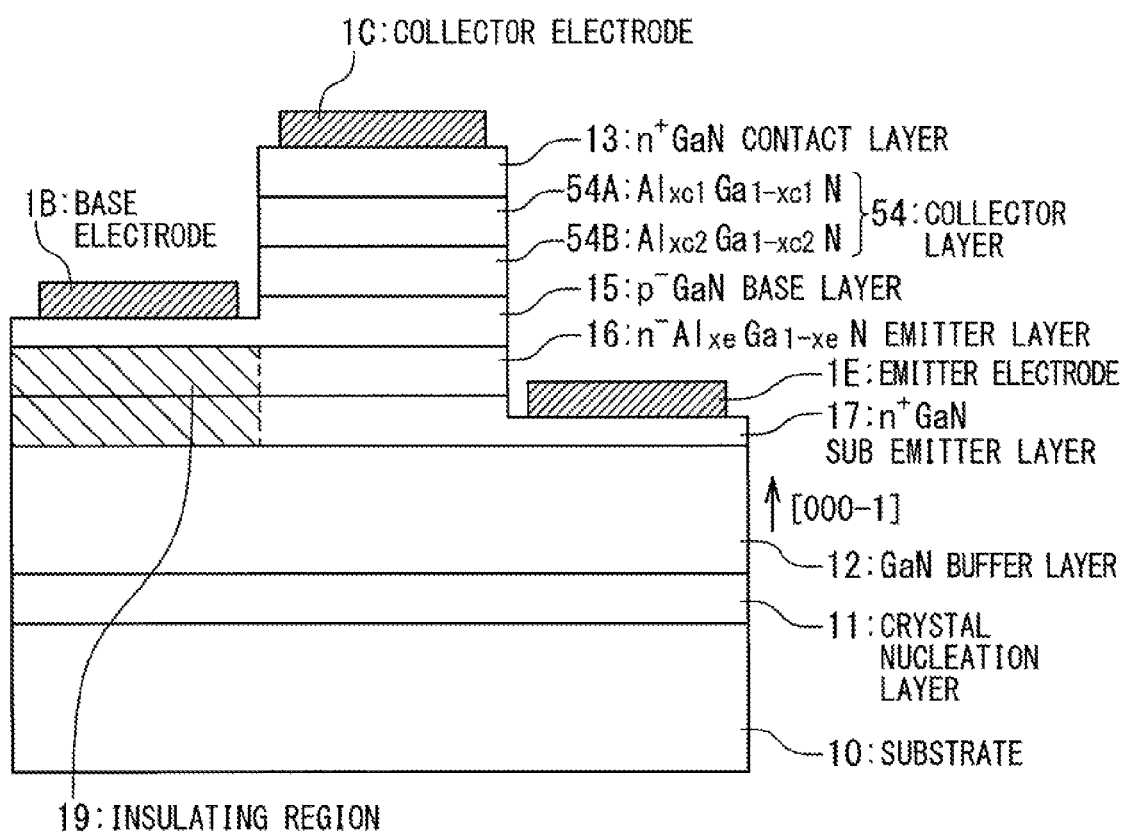
FIG. 12 is a sectional view showing the structure of the bipolar transistor according to a fifth exemplary embodiment of the present invention.

The structure of the bipolar transistor according to a fifth exemplary embodiment of the present invention will be described below. FIG. 12 is a sectional view showing the structure of the bipolar transistor according to the fifth exemplary embodiment of the present invention. In the above-mentioned exemplary embodiments, the gradient composition AlGaN layer, in which the Al composition is gradually changed, is used as the collector layer. In order to manufacture such an epitaxial layer, a flow rate of raw gas needs to be changed with time, which introduces a difficulty in the control property of a crystal composition. Thus, it is not easy to keep the reproducibility and uniformity of an element property at a high level. In the fifth exemplary embodiment, the reproducibility and uniformity of the element property as mentioned above can be kept at the high level.

As shown in FIG. 12, the bipolar transistor is provided with the substrate 10, the crystal nucleation layer 11, the buffer layer 12, the sub emitter layer 17, the emitter layer 16, the base layer 15, a collector layer 54, the contact layer 13, the insulating region 19, the emitter electrode 1E, the base electrode 1B and the collector electrode 1C.

In the present exemplary embodiment, the collector layer 14 of the bipolar transistor in the first exemplary embodiment is replaced by the collector layer 54. The collector layer 54 has a 2-layer structure in which an undoped $Al_{xc2}Ga_{1-xc2}N$ layer 54B of uniform composition and an undoped $Al_{xc1}Ga_{1-xc1}N$ layer 54A of uniform composition are laminated in this order.

It is supposed that the Al composition xc1 of the $Al_{xc1}Ga_{1-xc1}N$ layer 54A is more than the Al composition xc2 of the $Al_{xc2}Ga_{1-xc2}N$ layer 54B. Here, $0 \bullet xc2 < xc1 \bullet 1$ is satisfied. For example, it is supposed that xc1=0.2 and xc2=0.1 are satisfied, the layer thickness of the $Al_{0.2}Ga_{0.8}N$ layer 54A is 100 nm, and the layer thickness of the $Al_{0.1}Ga_{0.9}N$ layer 54B is 500 nm. Here, the film thickness of the AlGaN layer 54A and the film thickness of the AlGaN layer 54B are equal to or less than the critical film thickness upon dislocation generation. The manufacturing method of this bipolar transistor is the same as that of the first exemplary embodiment except that the materials of a part of films are different.

The feature of the present exemplary embodiment lies in the structure that the collector layer 55 is formed from the AlGaN layer of stepped composition, which includes the AlGaN layer 54B of low Al composition and the AlGaN layer 54A of high Al composition. Since the epitaxial growth becomes easy, the control property for the crystal composition is improved, and the reproducibility and uniformity of the element property are improved.

Figure 13:
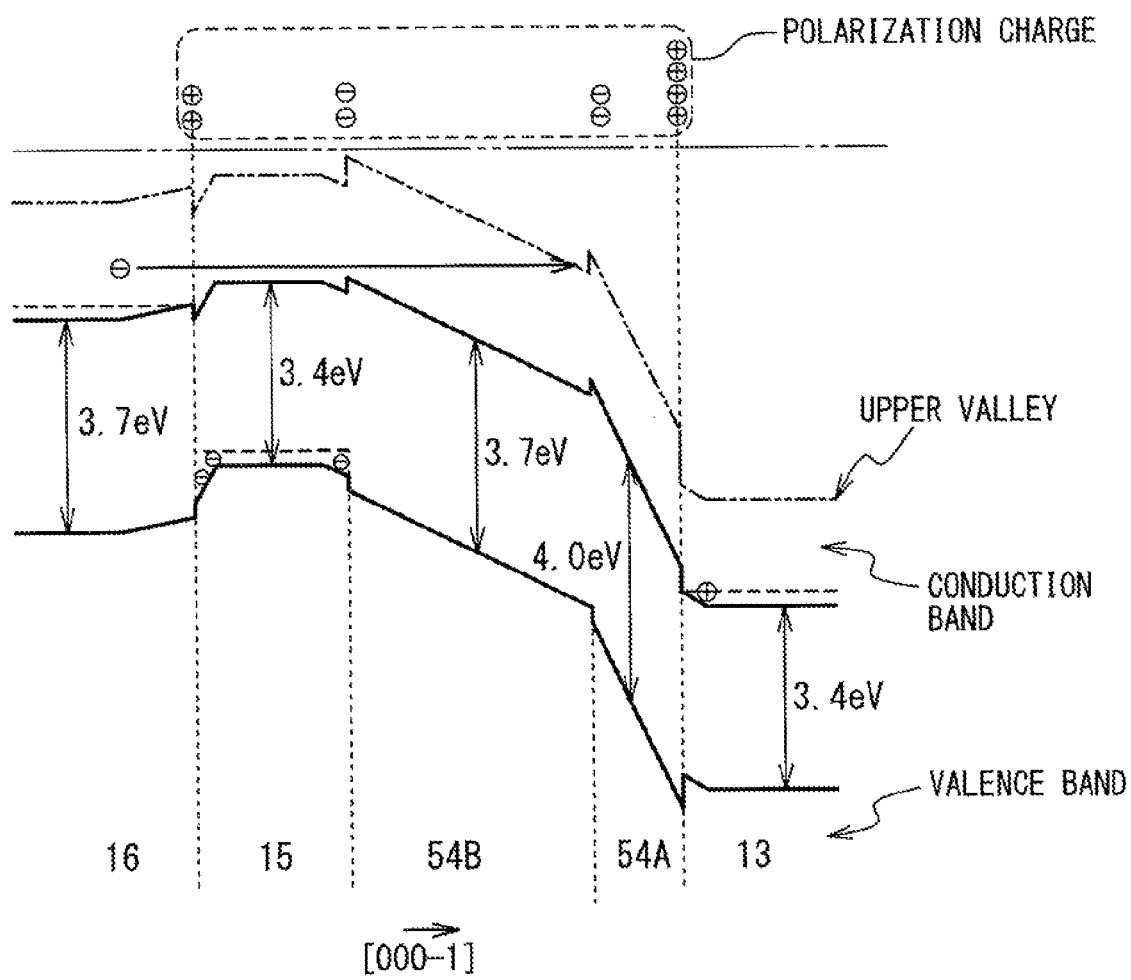
FIG. 13 is a diagram showing one example of an energy band of the bipolar transistor according to the fifth exemplary embodiment of the present invention.

The energy band of such a bipolar transistor will be described below. FIG. 13 is a diagram showing one example of the energy band of the bipolar transistor according to the fifth exemplary embodiment of the present invention. The energy band structure shows a case that in the bipolar transistor shown in FIG. 12, xe=0.1, xc1=0.2 and xc2=0.1 are satisfied, and a forward bias is applied between the base and the emitter (the base layer 15 and the emitter layer 16), and a reverse bias is applied between the base and the collector (the base layer 15 and the collector layer 54).

Since negative charges are generated in the boundary between the AlGaN layer 54A and the AlGaN layer 54B, the electric field becomes discontinuous, and the position at which the electric field strength is maximum is located inside the AlGaN layer 54A. Thus, it becomes difficult for the electrons injected into the collector layer 54B from the base layer 15 to have high energies. Therefore, the valley scattering is suppressed, thereby improving the carrier velocity and improving the cut-off frequency.

Also, the band gap of the AlGaN layer 54A is larger than that of the AlGaN layer 54B. Also, the electric field strength is maximum in the AlGaN layer 54A. Thus, the band gap at the position at which the electric field is maximum becomes larger, which makes it difficult to cause the avalanche breakdown. Therefore, the collector breakdown voltage is also improved.

Moreover, since the AlGaN layer 54B is larger in band gap than the GaN base layer 15, the valence band offset functions as a potential barrier against the holes. For this reason, the diffusion of the holes inside the base layer 15 into the AlGaN layer 54B from the collector layer 54 is suppressed, thereby improving the Kirk effect.

[Sixth Exemplary Embodiment]

Figure 14:
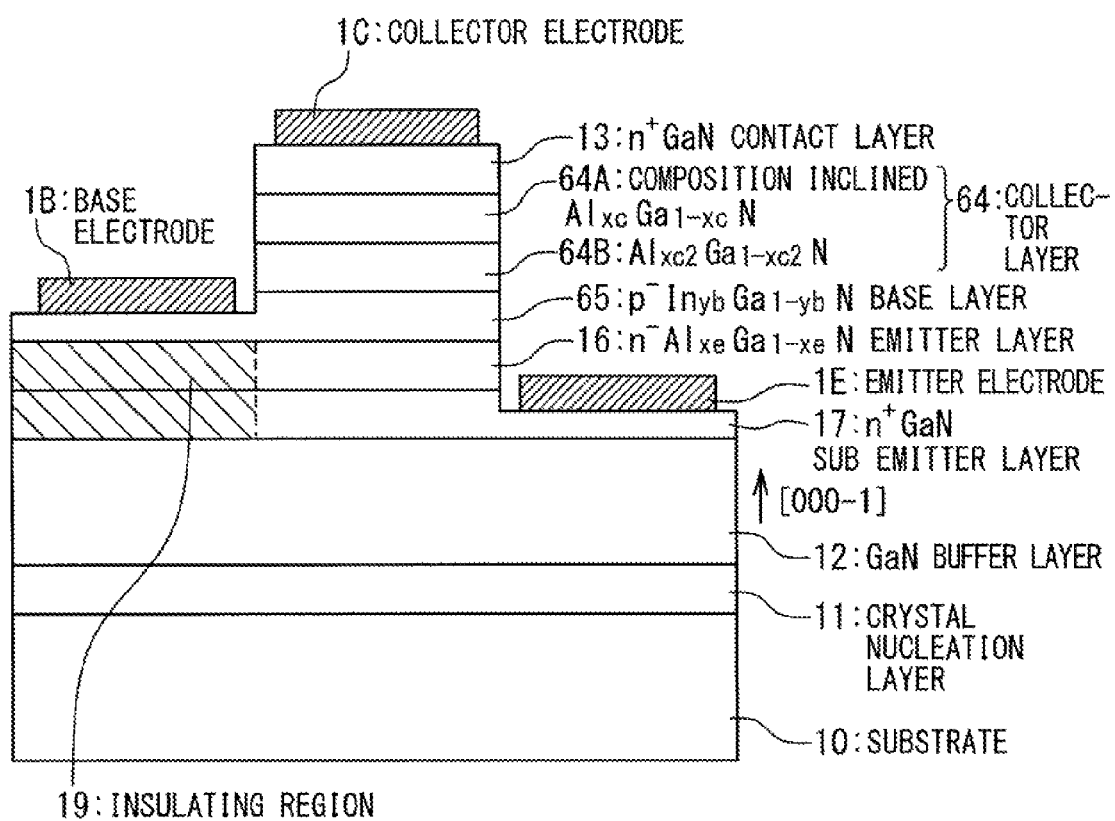
FIG. 14 is a sectional view showing the structure of the bipolar transistor according to a sixth exemplary embodiment of the present invention.

The structure of the bipolar transistor according to a sixth exemplary embodiment of the present invention will be described below. FIG. 14 is a sectional view showing the structure of the bipolar transistor according to the sixth exemplary embodiment of the present invention. For example, in the first to third exemplary embodiments, in the boundary between the base and the collector (the base layer and the collector layer), the materials of the base side and the materials of the collector, side are made of the same GaN. For this reason, since the holes inside the base layer 15 are diffused into the collector layer 34 and the base length is substantially enlarged which reduces the switching speed, and the possibility of the generation of the so-called Kirk effect can be considered. In the sixth exemplary embodiment, it is possible to surely protect the generation of the Kirk effect.

As shown in FIG. 14, the bipolar transistor is provided with the substrate 10, the crystal nucleation layer 11, the buffer layer 12, the sub emitter layer 17, the emitter layer 16, a base layer 65, a collector layer 64, the contact layer 13, the insulating region 19, the emitter electrode 1E, the base electrode 1B and the collector electrode 1C.

In the present exemplary embodiment, the collector layer 14 of the bipolar transistor in the first exemplary embodiment is replaced by the collector layer 64. The collector layer 64 has a 2-layer structure in which an undoped $Al_{xc2}Ga_{1-xc2}N$ layer 64B and an undoped gradient composition $Al_{xc}Ga_{1-xc}N$ layer 64A are laminated in this order. Also, the base layer 65 is configured from a p-type $In_{yb}Ga_{1-yb}N$ layer.

The Al composition xc of the gradient composition $Al_{xc}Ga_{1-xc}N$ layer 64A is gradually increased from xc2 to xc1 from the AlGaN layer 64B toward the contact layer 13 (n-type GaN layer). Here, $0 \bullet xc2 < xc1 \bullet 1$ is satisfied. The state of the gradient composition $Al_{xc}Ga_{1-xc}N$ layer 64A is exemplified as the state of the collector layer 14 (AlGaN layer) shown in FIG. 4C. For example, it is supposed that xc1=0.2 and xc2=0.1 are satisfied, and the layer thickness of the gradient composition $Al_{xc}Ga_{1-xc}N$ layer 64A is 500 nm, and the layer thickness of the $Al_{xc2}Ga_{1-xc2}N$ layer 44B (GaN layer) is 500 nm. Here, the film thickness of the gradient composition AlGaN layer 64A is equal to or less than the critical film thickness upon dislocation generation.

It is supposed that the In composition yb of the base layer 65 of the $In_{yb}Ga_{1-yb}N$ layer is in a range of $0 \bullet yb \bullet 1$. From the viewpoint of suppressing dislocation generation and excellent crystal quality, $0 \bullet yb \bullet 0.1$ is further preferable. In the present exemplary embodiment, for example, supposing that yb=0.05 is satisfied and the thickness of the InGaN layer 65 is 100 nm, it is within the critical film thickness upon dislocation generation. The manufacturing method of the bipolar transistor is the same as that of the first exemplary embodiment except that the materials of a part of films are different.

The feature of the present exemplary embodiment lies in a structure that the base layer 65 is formed from the InGaN layer whose band gap is smaller than that of the GaN layer, and the collector layer 64 is composed of the gradient composition AlGaN layer 64A and the AlGaN layer 64B. In particular, the GaN layer 64B of xc2=0 is larger in band gap than the InGaN layer of the base layer 65. Thus, the valence band offset functions as a potential barrier against holes. Therefore, the diffusion of the holes inside the base layer 15 from the collector layer 64 into the GaN layer 64B is suppressed, thereby improving the Kirk effect.

Figure 15:
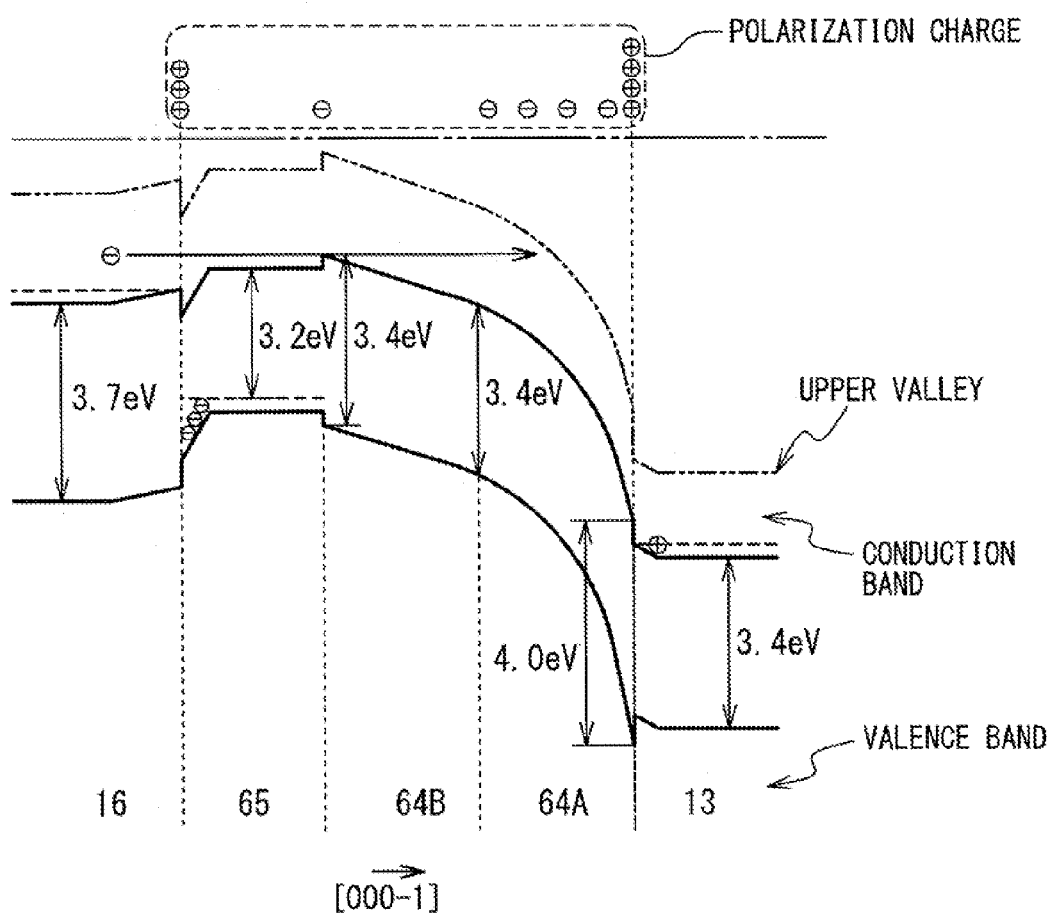
FIG. 15 is a diagram showing one example of an energy band of the bipolar transistor according to the sixth exemplary embodiment of the present invention.

The energy band of such a bipolar transistor will be described below. FIG. 15 is a diagram showing one example of the energy band structure of the bipolar transistor according to the sixth exemplary embodiment of the present invention. The energy band structure shows a case where in the bipolar transistor in FIG. 14, it is assumed that xe=0.1, yb=0.05, xc1=0.2 and xc2=0 are satisfied, and a forward bias is applied between the base and the emitter (the base layer 65 and the emitter layer 16), and a reverse bias is applied between the base and the collector (the base layer 65 and the collector layer 64).

The electric field strength inside the GaN layer 64B is uniform. On the other hand, negative charges are generated inside the gradient composition $Al_{xc}Ga_{1-xc}N$ layer 44A. Thus, the internal electric field is generated so that a potential to electrons is convex in an upper direction. In this case, the electric field concentration in the boundary between the base and the collector (the base layer 65 and the collector layer 64) is relaxed. Together with it, the position at which the electric field strength is maximum is shifted to the contact layer 13. Therefore, it becomes difficult for the electrons injected from the base layer 65 into the GaN layer 64B of the collector layer 64 to have high energies. Thus, the valley scattering is suppressed, thereby improving the carrier velocity and improving the cut-off frequency.

Also, the band gap of the AlGaN layer 64A becomes larger toward the contact layer 13 (GaN layer). The position at which the electric field strength is maximum is also shifted to the contact layer 13. Thus, the band gap at the position at which the electric field is maximum becomes larger, which makes it difficult to cause the avalanche breakdown. Therefore, the collector breakdown voltage is also improved.

[Seventh Exemplary Embodiment]

Figure 16:
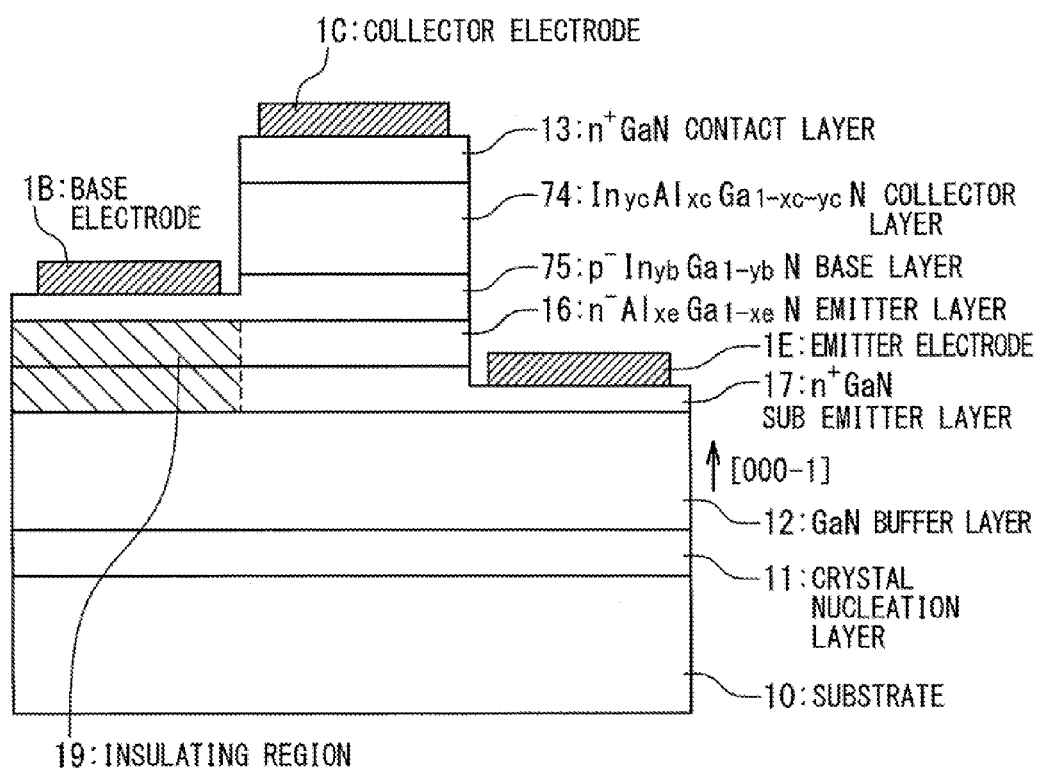
FIG. 16 is a sectional view showing the structure of the bipolar transistor according to a seventh exemplary embodiment of the present invention.

The structure of the bipolar transistor according to a seventh exemplary embodiment of the present invention will be described below. FIG. 16 is a sectional view showing the structure of the bipolar transistor according to the seventh exemplary embodiment of the present invention. In the above-mentioned exemplary embodiments, in the (000-1) plane growth, the Al composition ratio in the AlGaN layer inside the collector layer increases from the base layer toward the collector layer. At this time, as the Al composition increases, the a-axis length of the AlGaN decreases. Thus, negative charges are generated inside the AlGaN layer. Similarly, the a-axis length of the InAlGaN layer decreases as the In composition decreases. For this reason, the collector layer is configured from the InAlGaN layer, and even if the In composition decreases from the base layer toward the collector layer, the similar effect can be obtained. Or, the collector layer is configured from the InAlGaN layer, and the Al composition may be increased from the base layer toward the collector layer. In this way, in the seventh exemplary embodiment, the collector layer is configured from the InAlGaN layer.

As shown in FIG. 16, the bipolar transistor is provided with the substrate 10, the crystal nucleation layer 11, the buffer layer 12, the sub emitter layer 17, the emitter layer 16, a base layer 75, a collector layer 74, the contact layer 13, the insulating region 19, the emitter electrode 1E, the base electrode 1B and the collector electrode 1C.

In the present exemplary embodiment, the collector layer 14 in the bipolar transistor in the first exemplary embodiment is replaced by the collector layer 74, and the base layer 15 is replaced by the base layer 75. The collector layer 74 is configured from the undoped $In_{yc}Al_{xc}Ga_{1-xc-yc}N$ layer 74, and the base layer 75 is configured from a p-type $In_{yb}Ga_{1-yb}N$ layer.

The collector layer 74 (InAlGaN layer) has a gradient composition structure or a stepped composition structure in which the Al composition xc or the In composition yc is modulated in the film thickness direction. It is supposed that the Al composition is xc=xc1 in the boundary with the contact layer 13 (n-type GaN layer) of the collector layer 74 and the In composition is yc=yc1, and in the boundary with the base layer 75 (p-type InGaN layer), the Al composition is xc=xc2 and the In composition is yc=yc2. Here, 0•xc2<xc1•1 and 0•yc1•yc2 are satisfied. Then, the Al composition xc of the collector layer 74 (InAlGaN layer) is increased or constant from the base layer 75 toward the contact layer 13. Also, the In composition yc is decreased or constant from the base layer 75 toward the contact layer 13. The collector layer 74 is thinner than the critical film thickness upon dislocation generation and serves as a strain lattice layer.

Here, in the collector layer 74 (InAlGaN layer), its average Al composition is defined as <xc> and its average In composition is defined as <yc>. At that time, a condition under which the a-axis length of the InAlGaN layer coincides with the a-axis length of the GaN, so that the lattice matching is attained is represented by the following equation (1).

$$<xc>=4.6<yc> \quad (1)$$

From the above, in order to suppress the dislocation generation and get excellent crystal quality, the following equation (2) must be satisfied.

$$|<xc>-4.6<yc>|<0.5 \quad (2)$$

The In composition yb of the base layer 75 (InGaN layer) is set to satisfy 0•yb•1. From the viewpoint of suppressing the dislocation generation and getting the excellent crystal quality, 0•yb•0.1 is further preferred to be set. The manufacturing method of the bipolar transistor is the same as that of the first exemplary embodiment except that the materials of a part of films are different.

Figure 17A:
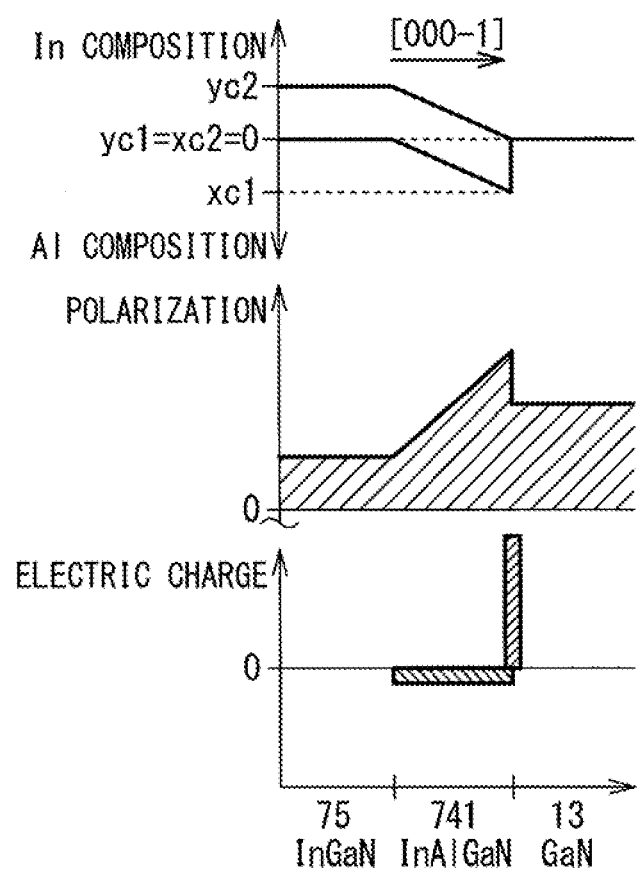
FIG. 17A is a graph showing a typical example of an (Al, In) composition distribution, a polarization quantity distribution and a charge distribution in the bipolar transistor according to the seventh exemplary embodiment of the present invention.
Figure 17B:
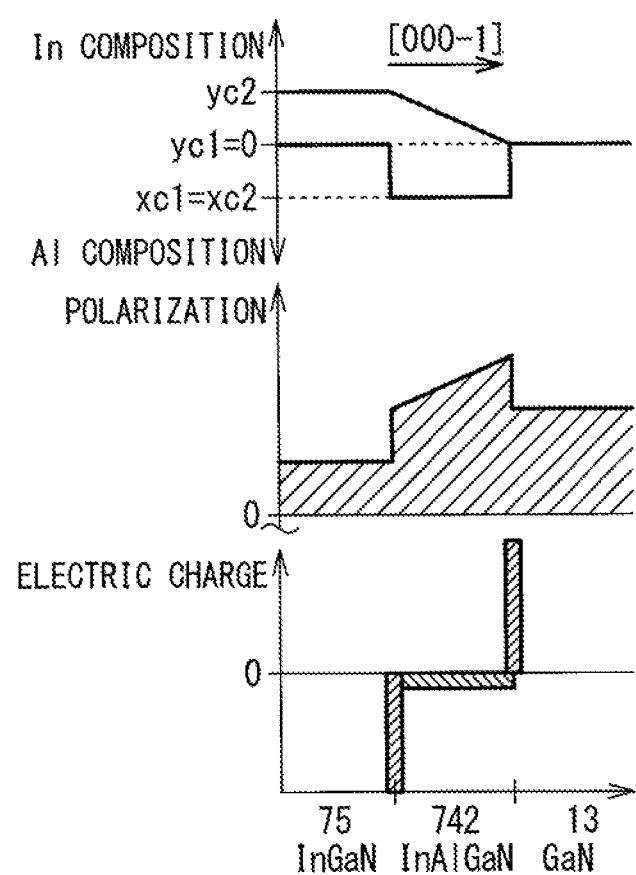
FIG. 17B is a graph showing a typical example of an (Al, In) composition distribution, a polarization quantity distribution and a charge distribution in the bipolar transistor according to the seventh exemplary embodiment of the present invention.
Figure 17C:
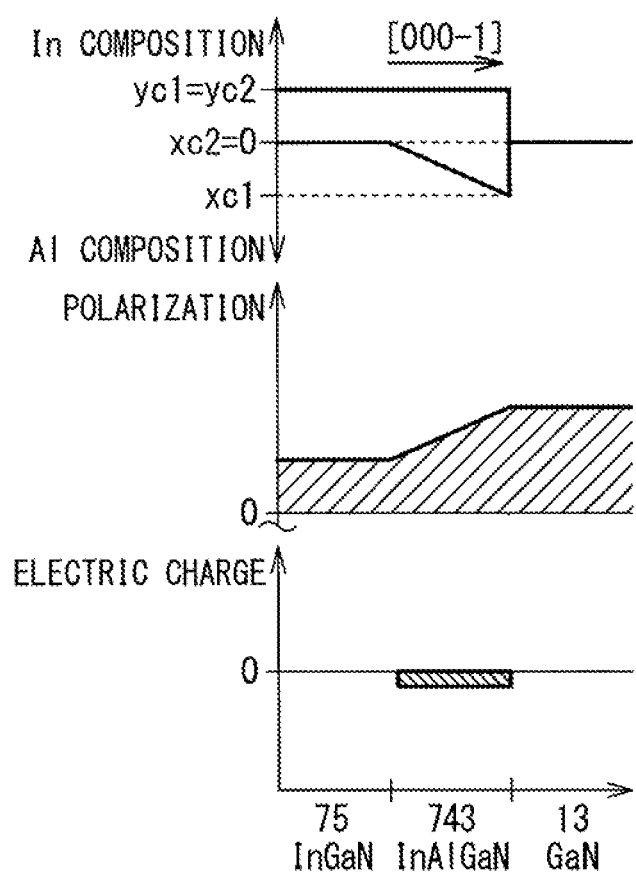
FIG. 17C is a graph showing a typical example of an (Al, In) composition distribution, a polarization quantity distribution and a charge distribution in the bipolar transistor according to the seventh exemplary embodiment of the present invention.

FIGS. 17A to 17C are graphs showing typical examples of an (Al, In) composition distribution, a polarization quantity distribution and a charge distribution in the bipolar transistor according to the seventh exemplary embodiment of the present invention. Here, in FIGS. 17A to 17C, the crystal composition of the collector layer 74 (InAlGaN layer) is selected such that the a-axis length decreases from the base layer 75 toward the contact layer 13. Also, the vertical axes indicate the In composition and the Al composition, the polarization and the charge, respectively, in order from the top. Here, in the Al composition, a positive direction is a downward direction. The horizontal axes indicate the positions (the base layer 75 (InGaN layer), the collector layer (InAlGaN layer) and the contact layer 13 (GaN layer) in the bipolar transistor, respectively.

FIG. 17A shows a case where the collector layer 74 ($In_{yc}Al_{xc}Ga_{1-xc-yc}N$ layer 74) is formed from an InAlGaN layer 741 having a gradient composition that satisfies 0•xc2<xc1•1 and 0•yc1<yc2•1. As indicated in the top, from the base layer 75 toward the contact layer 13, the Al composition of the InAlGaN layer 741 increases and the In composition decreases. Also, since the a-axis length decreases from the base layer 75 toward the contact layer 13, the polarization quantity is changed such that the positive polarization is increased from the base layer 75 toward the contact layer 13, as indicated in the middle portion. That is, the polarization quantity is changed in the film thickness direction. At that time, as indicated in the bottom portion, in a case of the (000-1) plane growth, negative charges are generated inside the InAlGaN layer 741. The positive charges are generated in the boundary between the contact layer 13 (GaN layer) and the InAlGaN layer 741.

FIG. 17B shows a case where the collector layer 74 is formed from an InAlGaN layer 742 having a gradient composition that satisfies 0•xc2=xc1•1 and 0•yc1<yc2•1. As indicated in the top portion, toward the contact layer 13 from the base layer 75, the In composition decreases while the Al composition of the InAlGaN layer 742 is constant. Also, since the a-axis length decreases toward the contact layer 13 from the base layer 75, the polarization quantity is changed in the film thickness direction, as indicated in the middle portion. For this reason, as indicated in the bottom portion, in a case of the (000-1) plane growth, negative charges are generated in the boundary between the InAlGaN layer 742 and the base layer 75 (InGaN layer). The negative charges are generated inside the InAlGaN layer 742. Positive charges are generated in the boundary between the contact layer (GaN layer) and the InAlGaN layer 742.

FIG. 17C shows a case where the collector layer 74 is formed by an InAlGaN layer 743 having a gradient composition that satisfies 0•xc2<xc1•1 and 0•yc1=yc2•1. As indicated in the top graph, toward the contact layer 13 from the base layer 75, while the In composition of the InAlGaN layer 743 is constant, the Al composition increases. Also, since the a-axis length decreases toward the contact layer 13 from the base layer 75, the polarization quantity is changed in the film thickness direction, as indicated in the middle graph. Thus, as indicated in the bottom graph, in the case of the (000-1) plane growth, the negative charges are generated inside the InAlGaN layer 743.

Figure 18:
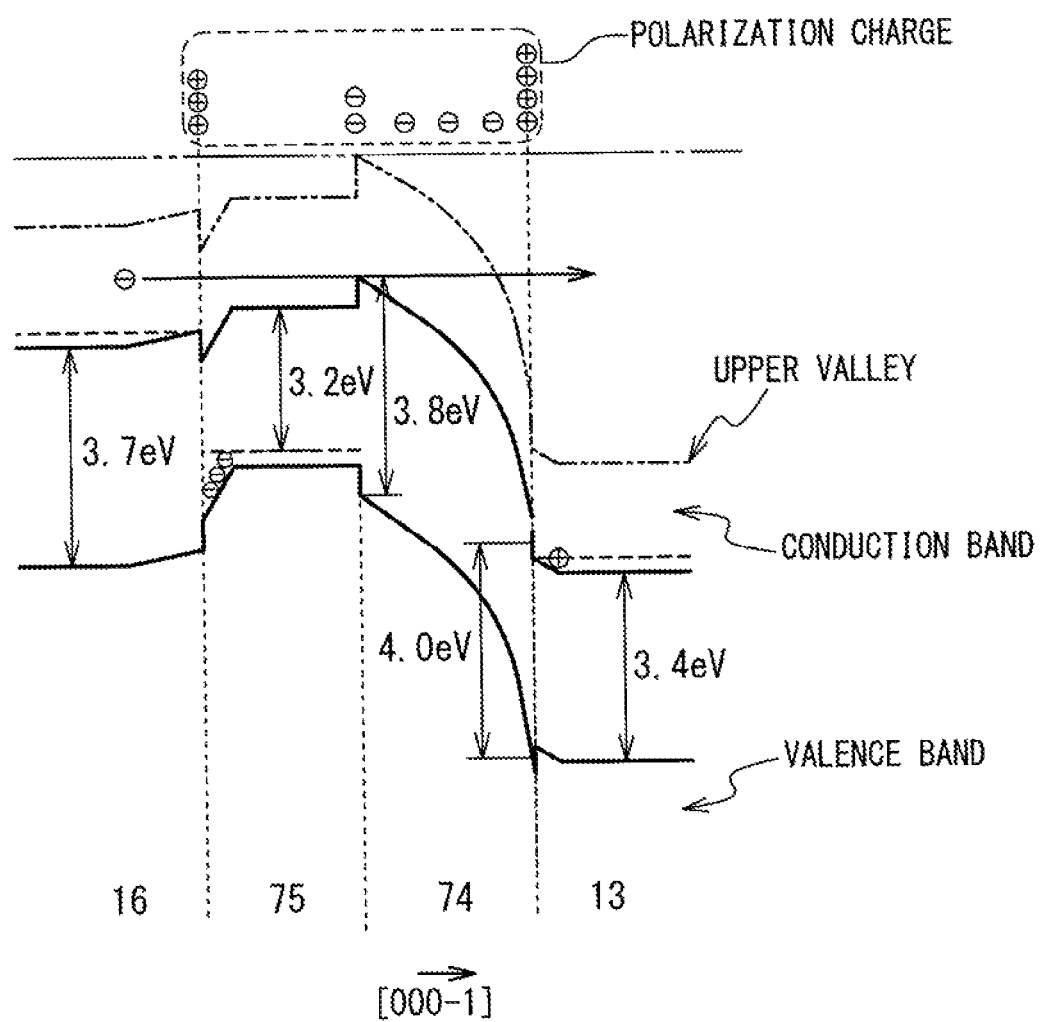
FIG. 18 is a diagram showing one example of an energy band of the bipolar transistor according to the seventh exemplary embodiment of the present invention.

As shown in the above drawings, in any of the cases of FIGS. 17A, 17B and 17C, the negative charges are generated inside the collector layer 74 (InAlGaN layer). Thus, the effect similar to the case on which the p-type doping is performed is obtained. As one example, the case of FIG. 17B is further described. FIG. 18 shows one example of the energy band structure of the bipolar transistor according to the seventh exemplary embodiment of the present invention. The energy band structure shows a case where in FIG. 17B, a forward bias is applied between the base and the emitter (the base layer 75 and the emitter layer 16) and a reverse bias is applied between the base and the collector (the base layer 75 and the collector layer 74). However, the crystal compositions are xe=0.1, yb=0.05, xc1=xc2=0.2, yc1=0 and yc2=0.05.

Here, since <xc>=0.2 and <yc>=0.025, |<xc>−4.6<yc>|=0.085, which satisfies the equation 2. The respective film thicknesses of the base layer 75 (InGaN layer) and the collector layer 74 (InAlGaN layer) are assumed to be equal to or less than the critical film thickness upon dislocation generation. For example, the InGaN layer of the base layer 75 may be 100 nm, and the gradient composition InAlGaN layer of the collector layer 74 may be 500 nm.

The internal electric field is generated inside the collector layer 74 (InAlGaN layer) such that a potential for the electrons is convex. Thus; the electric field concentration in the boundary between the base and the collector (the base layer 75 and the collector layer 74) is relaxed. Together with it, the position at which the electric field strength is maximum is shifted to the side of the contact layer 13. Therefore, it is difficult for the electrons injected into the collector layer 74 from the base layer 75 to have the high energy. Therefore, the valley scattering is suppressed, thereby improving the carrier velocity and improving the cut-off frequency.

Also, the band gap of the collector layer 74 is made larger toward the contact layer 13. The position at which the electric field strength is maximum is also shifted to the side of the contact layer 13. Thus, the band gap at the position at which the electric field is maximum is made larger, which makes it difficult to cause the avalanche breakdown. Therefore, the collector breakdown voltage is also improved.

In the present exemplary embodiment, the collector layer 74 is configured from the InAlGaN layer. However, the collector layer 74 may be configured from the $In_{yc}Ga_{1-yc}N$ layer so that the In composition yc decreases toward the contact layer 13 from the base layer 75. This corresponds to a case where xc1=xc2=0 is satisfied in FIG. 16. Also, in this case, similarly, the negative charges are generated inside the collector layer 74. Thus, the electric field concentration in the boundary between the base and the collector is relaxed, thereby improving the cut-off frequency and the collector breakdown voltage.

[Eighth Exemplary Embodiment]

Figure 19:
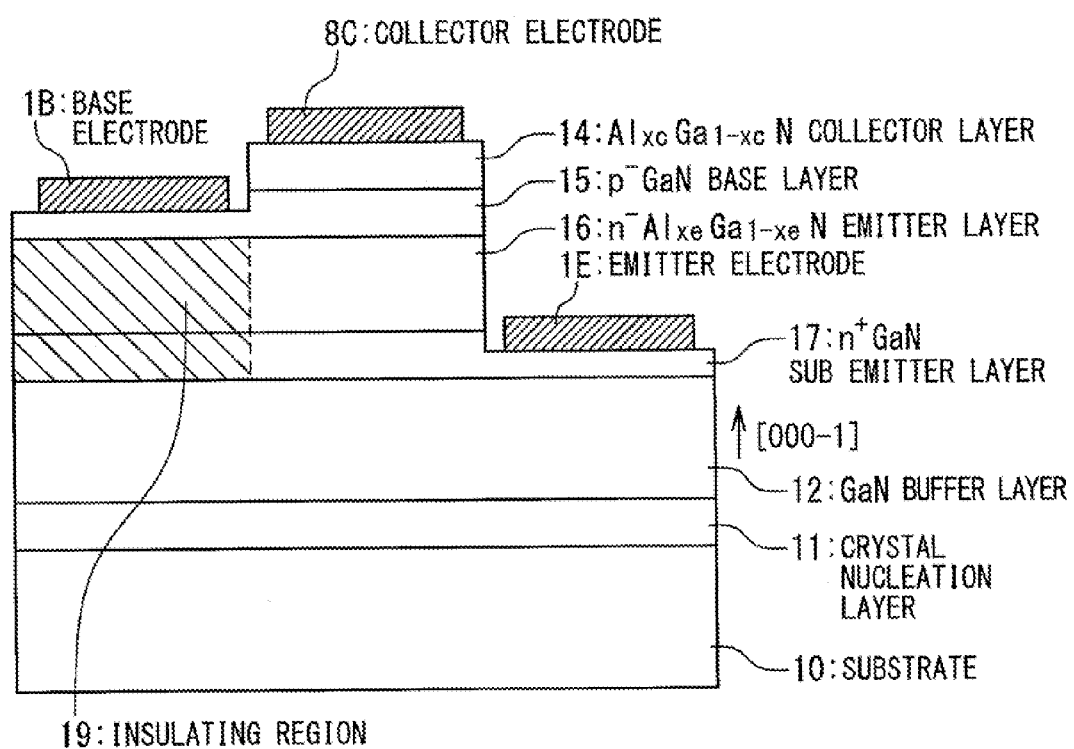
FIG. 19 is a sectional view showing the structure of the bipolar transistor according to an eighth exemplary embodiment of the present invention.

The structure of the bipolar transistor according to an eighth exemplary embodiment of the present invention will be described below. FIG. 19 is a sectional view showing the structure of the bipolar transistor according to the eighth exemplary embodiment of the present invention. In the above-mentioned exemplary embodiments, the collector electrode 1C is formed on the contact layer 13 of the n-type GaN layer so that an ohmic contact is attained. In this case, since a Schottky barrier exists between the n-type semiconductor and the collector electrode, a possibility that a contact resistance increases is considered. In the eighth exemplary embodiment, the contact resistance in the collector electrode can be decreased to a small value.

As shown in FIG. 19, the bipolar transistor is provided with the substrate 10, the crystal nucleation layer 11, the buffer layer 12, the sub emitter layer 17, the emitter layer 16, the base layer 15, the collector layer 14, the insulating region 19, the emitter electrode 1E, the base electrode 1B and a collector electrode 8C.

In the present exemplary embodiment, the contact layer 13 of the n-type GaN layer and the collector electrode 1C are removed from the bipolar transistor in the first exemplary embodiment. Instead, the collector electrode 8C is provided. The collector electrode 8C is made of metal in Schottky contact with the collector layer 14 of the AlGaN layer.

As the collector electrode 8C, for example, nickel/gold (Ni/Au) can be used. Or, other metals such as palladium/gold (Pd/Au), and platinum/gold (Pt/Au) may be used.

The feature of the present exemplary embodiment lies in a structure in which a collector contact is formed by the collector electrode 8C in Schottky contact with the collector layer 14 of the AlGaN layer. Such a collector electrode 8C functions as a so-called Schottky collector. Then, when a positive voltage is applied to the collector electrode 8C, a Schottky barrier to electrons is removed, which can decrease the contact resistance to an ultimate value.

Figure 20:
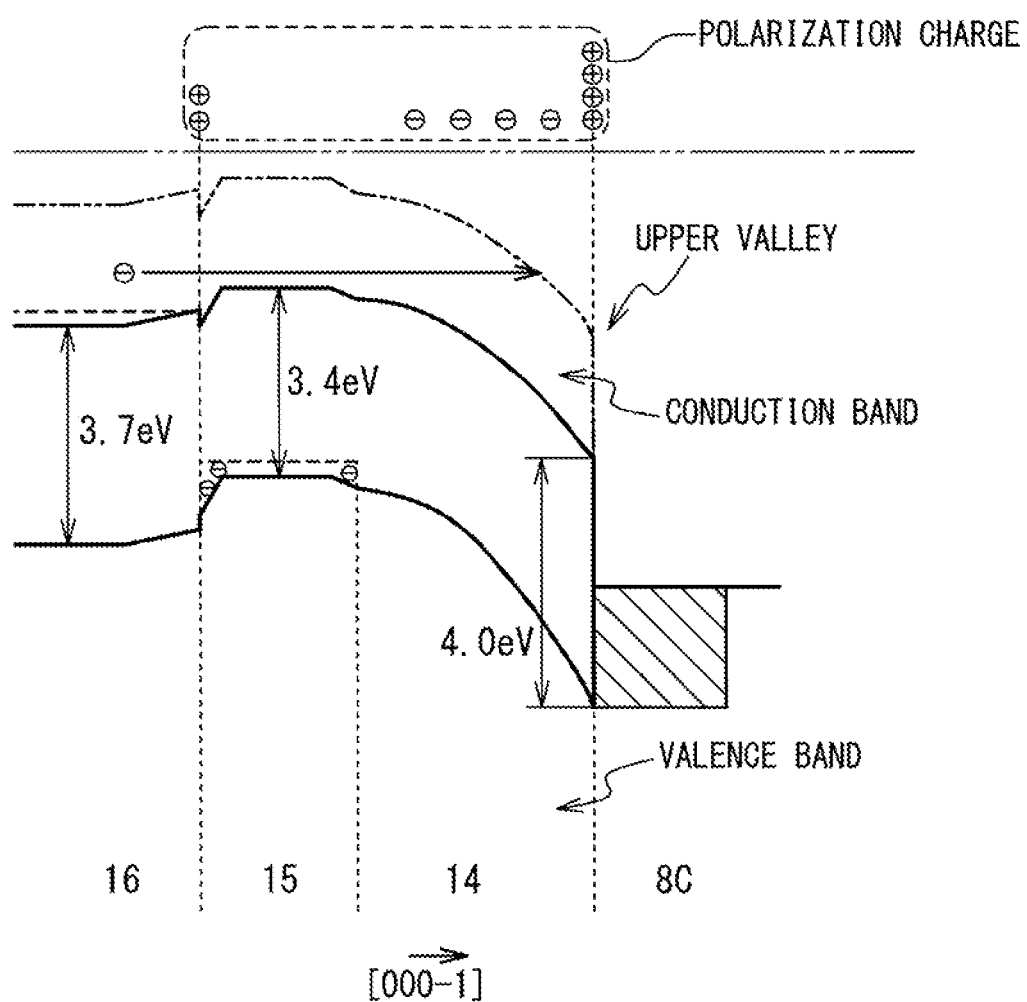
FIG. 20 is a diagram showing one example of an energy band view of the bipolar transistor according to the eighth exemplary embodiment of the present invention.

The energy band of such a bipolar transistor as mentioned above will be described below. FIG. 20 is a diagram showing one example of the energy band of the bipolar transistor according to the eighth exemplary embodiment of the present invention. The energy band structure shows a case where in the bipolar transistor of FIG. 19, xe=0.1, xc1=0.2 and xc2=0 are satisfied, and a forward bias is applied between the base and the emitter (the base layer 15 and the emitter layer 16) and a reverse bias is applied between the base and the collector (the base layer 15 and the collector layer 14).

As could be understood from FIG. 20, the electrons inside the collector layer 14 (AlGaN layer) arrive at the collector electrode 8C through a drift due to acceleration with electric field. Since the Schottky barrier does not exist between the collector layer 14 and the collector electrode 8C, the contact resistance can be decreased to an ultimate value.

Also, similarly to the first exemplary embodiment, negative charges are generated inside the gradient composition $Al_{xc}Ga_{1-xc}N$ layer of the collector layer 14. Thus, the internal electric field is generated so that a potential to electrons is convex in an upper direction. Thus, the electric field concentration in the boundary between the base and the collector (the base layer 15 and the collector layer 14) is relaxed. Together with it, the position at which the electric field strength is maximum is shifted to the side of the collector electrode 8C. Thus, it becomes difficult for the electrons injected from the base layer 15 into the collector layer 14 to have high energies. Therefore, the valley scattering is suppressed, thereby improving the carrier velocity and improving the cut-off frequency.

Also, the band gap of the collector layer 14 (AlGaN layer) becomes larger toward the collector electrode 8C. The position at which the electric field strength is maximum is also shifted to the side of the collector electrode 8C. Thus, the band gap at the position at which the electric field is maximum becomes larger, which makes it difficult to cause the avalanche breakdown. Therefore, the collector breakdown voltage is also improved.

In the present exemplary embodiment, a Schottky collector structure is applied to the first exemplary embodiment. However, this structure can be similarly applied to the other exemplary embodiments. Also, in that case, similarly, the effect of reduction in the contact resistance can be obtained.

In the above-mentioned exemplary embodiments, SiC is used as the substrate. However, different substrates formed of materials such as silicon (Si), sapphire (Al$_2$O$_3$) and gallium nitride (GaN) may be used. Also, although AlGaN has been used as the material of the emitter layer, the different III-group element nitride semiconductor which has a band gap not smaller than the base layer may be used. For example, AlN, InAlN and InAlGaN may be used. Moreover, GaN or InGaN is used as the material of the base layer. However, the different III-group element nitride semiconductor which has a band gap not larger than the collector layer may be used. For example, InN, AlGaN, InAlN and InAlGaN may be used. Moreover, GaN is used as the materials of the sub emitter layer and the contact layer. However, the different III-group element nitride semiconductor may be used. For example, InN, InGaN, InAlN, AlGaN and InAlGaN may be used.

In the above-mentioned exemplary embodiments, the present invention has been described by using the bipolar transistor of a collector-up structure. However, the key point of the present invention lies in that the crystal growth direction with respect to the substrate surface is parallel to the [000-1] direction, and that the collector layer is formed of (In)AlGaN which is subjected to the composition modulation in which the a-axis length decreases from the substrate toward the surface, and consequently, negative fixed charges are generated. Even if the position relation between the base layer and the emitter layer is opposite, the negative charges are generated inside the collector layer. Thus, the similar effect is obtained. Therefore, in the bipolar transistor of the emitter-up structure in which the crystal growth direction with respect to the substrate surface is parallel to the [000-1] direction, the collector layer may be formed of (In)AlGaN having the composition modulation in which the a-axis length decreases from the substrate toward the surface.

As mentioned above, the bipolar transistor of the present invention has an n-type conductive emitter layer composed of a first nitride semiconductor, a p-type conductive base layer composed of a second nitride semiconductor, and a collector layer composed of a third nitride semiconductor represented by the composition formula of In$_{yc}$Al$_{xc}$Ga$_{1-xc-yc}$N (0•xc•1, 0•yc•1, 0<xc+yc•1) so that the crystal growth direction with respect to the substrate surface is parallel to the [000-1] direction. The bipolar transistor is formed such that in at least a portion of the collector layer, the a-axis length decreases from the substrate toward the surface. Since the negative charges are generated inside the InAlGaN layer due to polarization effect, the electric field concentration in the boundary between the base and the collector is relaxed. It becomes difficult for electrons injected from the base layer into the collector layer to have high energies. Thus, the valley scattering is suppressed, thereby improving the carrier velocity and improving the cut-off frequency. Also, the band gap at the position at which the electric field strength is maximum is large, which makes it difficult to cause the avalanche breakdown. This greatly contributes to a higher breakdown voltage and higher operation speed of the bipolar transistor.

As mentioned above, the present invention has been described on the basis of the above-mentioned exemplary embodiments. However, the present invention is not limited to the above-mentioned exemplary embodiments. Various modifications within the technical scope of the present invention can be performed on the structures and details of the present invention by one skilled in the art. Also, a part or whole of the exemplary embodiments can be combined with each other, unless any technical conflict is not generated between each other.

The invention claimed is:

1. A bipolar transistor comprising:
   a substrate;
   an n-type emitter layer formed above said substrate and including a first nitride semiconductor;
   a p-type base layer formed on said emitter layer and including a second nitride semiconductor; and
   a collector layer formed on said base layer and including a third nitride semiconductor,
   wherein said collector layer, said base layer and said emitter layer are formed such that a crystal growth direction to a surface of said substrate is parallel to [000-1] direction of said substrate,
   wherein said third nitride semiconductor comprises In$_{yc}$Al$_{xc}$Ga$_{1-xc-yc}$N (0≤xc≤1, 0≤yc≤1, 0<xc+yc≤1), and
   wherein an a-axis length of said third nitride semiconductor on a surface side is shorter than the a-axis length thereof on a side of said substrate.

2. The bipolar transistor according to claim 1, wherein the a-axis length of said third nitride semiconductor decreases from the side of said substrate toward the surface side.

3. The bipolar transistor according to claim 2, wherein an Al composition xc of said third nitride semiconductor increases from the side of said substrate toward the side of the surface.

4. The bipolar transistor according to claim 3, wherein when an average Al composition of said third nitride semiconductor is expressed by <xc> and an average In composition thereof is expressed by <yc>, said third nitride semiconductor satisfies the following equation:

$$|<xc>-4.6<yc>|<0.5\bullet$$

5. The bipolar transistor according to claim 3, wherein said collector layer further comprises a fourth nitride semiconductor provided to contact said third nitride semiconductor, and wherein said fourth nitride semiconductor comprises Al$_{xc2}$Ga$_{1-xc2}$N (0≤xc2<xc≤1).

6. The bipolar transistor according to claim 5, wherein said base layer comprises In$_{yb}$Ga$_{1-yb}$N (0≤yb≤1).

7. The bipolar transistor according to claim 2, wherein an In composition yc of said third nitride semiconductor decreases from the side of said substrate toward the side of the surface.

8. The bipolar transistor according to claim 7, wherein when an average Al composition of said third nitride semiconductor is expressed by <xc> and an average In composition thereof is expressed by <yc>, said first nitride semiconductor satisfies the following equation:

$$|<xc>-4.6<yc>|<0.5\bullet$$

9. The bipolar transistor according to claim 1, wherein said emitter layer, said base layer, said collector layer are formed on said substrate in this order.

10. The bipolar transistor according to claim 1, wherein a band gap of said third nitride semiconductor is larger than that of said second nitride semiconductor in an interface of said base layer and said collector layer.

11. The bipolar transistor according to claim 1, further comprising:
   an n-type conductive contact layer to contact with a said collector layer;
   a first ohmic electrode electrically connected with said emitter layer;

a second collector electrode electrically connected with said base layer; and a third ohmic electrode electrically connected with said contact layer.

12. The bipolar transistor according to claim 9, further comprising:

a first ohmic electrode electrically connected with said emitter layer;

a second ohmic electrode electrically connected with said base layer; and a shottky electrode electrically connected with said collector layer.

* * * * *